(12) United States Patent
Jeong et al.

(10) Patent No.: US 12,154,653 B2
(45) Date of Patent: Nov. 26, 2024

(54) SEMICONDUCTOR DEVICE FOR PERFORMING DATA ALIGNMENT OPERATION

(71) Applicant: SK hynix Inc., Icheon-si Gyeonggi-do (KR)

(72) Inventors: Young Mok Jeong, Icheon-si Gyeonggi-do (KR); Min Gyu Park, Icheon-si Gyeonggi-do (KR); Min Su Park, Icheon-si Gyeonggi-do (KR)

(73) Assignee: SK hynix Inc., Icheon-si Gyeonggi-do (KR)

( * ) Notice: Subject to any disclaimer, the term of this patent is extended or adjusted under 35 U.S.C. 154(b) by 174 days.

(21) Appl. No.: 17/952,008

(22) Filed: Sep. 23, 2022

(65) Prior Publication Data

US 2023/0386535 A1    Nov. 30, 2023

(30) Foreign Application Priority Data

May 30, 2022    (KR) .................. 10-2022-0066390

(51) Int. Cl.
G11C 8/00 (2006.01)
G11C 7/10 (2006.01)

(52) U.S. Cl.
CPC .......... *G11C 7/1093* (2013.01); *G11C 7/1087* (2013.01); *G11C 7/1096* (2013.01)

(58) Field of Classification Search
CPC .................................................. G11C 7/1093

USPC ....................................................... 365/233.1
See application file for complete search history.

(56) References Cited

U.S. PATENT DOCUMENTS

2002/0118575 A1* 8/2002 Sonoda ................ G11C 7/1078
365/191

FOREIGN PATENT DOCUMENTS

KR    1020110130915 A    12/2011
KR    1020180131861 A    12/2018

* cited by examiner

*Primary Examiner* — Hoai V Ho
(74) *Attorney, Agent, or Firm* — WILLIAM PARK & ASSOCIATES LTD.

(57) ABSTRACT

A semiconductor device includes an alignment data generation circuit aligning first and second latch data generated from a first group of input data in synchronization with a first internal strobe signal, outputting the aligned first and second latch data as first alignment data, aligning a first and second latch data generated from a second group of the input data in synchronization with a second internal strobe signal, and outputting the aligned first and second latch data as second alignment data. The semiconductor device includes a write data generation circuit generating first and second write data from the first and second alignment data in synchronization with a latch clock after the start of a first operation mode and generating the first and second write data from the first alignment data in synchronization with the latch clock after the start of a second operation mode.

15 Claims, 20 Drawing Sheets

SEMICONDUCTOR DEVICE FOR PERFORMING DATA ALIGNMENT OPERATION

CROSS-REFERENCE TO RELATED APPLICATION

The present application claims priority under 35 U.S.C. § 119(a) to Korean application number 10-2022-0066390, filed in the Korean Intellectual Property Office on May 30, 2022, the entire disclosure of which is incorporated herein by reference.

BACKGROUND

The present disclosure relates to a semiconductor device, and more particularly to a device for performing a data alignment operation for a semiconductor memory device.

In general, a semiconductor memory device including a double data rate synchronous DRAM (DDR SRAM) performs a read operation and a write operation in response to a command received from an external device. In order to perform such operations, the semiconductor memory device may use a data alignment circuit to align multiple data that are consecutively received.

Furthermore, the semiconductor memory device may use a strobe signal for strobing data in order to perform the read operation and the write operation.

SUMMARY

In an embodiment, a semiconductor device includes an alignment data generation circuit configured to: align first and second latch data generated from a first group of input data, in synchronization with a first internal strobe signal, output the aligned first and second latch data as first alignment data, align a first and second latch data generated from a second group of the input data in synchronization with a second internal strobe signal, output the aligned first and second latch data as second alignment data. The semiconductor device also includes a write data generation circuit configured to: generate first and second write data from the first and second alignment data in synchronization with a latch clock after the start of a first operation mode and generate the first and second write data from the first alignment data in synchronization with the latch clock after the start of a second operation mode. The first write data and the second write data may have an identical data window in a continuous operation of the first operation mode and the second operation mode.

In an embodiment, a semiconductor device includes a mode control circuit configured to generate a burst enable signal that is enabled in a second operation mode based on a mode register signal, a burst control signal, and a mode setting signal for setting a first operation mode and the second operation mode in synchronization with a latch clock that is generated from a clock, and a data alignment circuit configured to: align a first group and second group of input data in synchronization with first to third internal strobe signals that are generated from a strobe signal, generate first and second write data from at least any one of the aligned first group and second group of the input data based on a logic level of the burst enable signal in synchronization with the latch clock, and generate internal data from the first and second write data.

DETAILED DESCRIPTION

In the descriptions of the following embodiments, the term "preset" indicates that the numerical value of a parameter is determined prior to the parameter being used in a process or algorithm. The numerical value of the parameter may be set before or when the process or algorithm is started or while the process or algorithm is being performed.

Terms such as "first" and "second," which are used as labels to distinguish among the various components, are not limited by the components nor necessarily indicate a specific order. For example, a first component may be referred to as a second component, and vice versa, in the descriptions.

When one component is referred to as being "coupled" or "connected" to another component, it should be understood that the components may be directly coupled or connected to each other or coupled or connected to each other through another component interposed in between. In contrast, when one component is referred to as being "directly coupled" or "directly connected" to another component, it should be understood that the components are directly coupled or connected to each other without another component interposed in between.

A "logic high level" and a "logic low level" are used to describe the logic levels of signals without necessarily indicating the voltage level. For an "active high" signal, an asserted signal may be at a logic high level that is a high voltage level, and a deasserted signal may be at a logic low level that is at a low voltage level. For an "active low" signal, an asserted signal may be at a logic high level that is at a low voltage level, and a deasserted signal may be at a logic low level that is at a high voltage level. Some active low signals may be signified as such by appending the letter 'n' in front of the signal name. For example, an active low error signal may be labeled "nERROR," while an active high error signal may be labeled "ERROR."

Hereafter, the teachings of the present disclosure will be described in more detail through various embodiments. The embodiments are only used to exemplify the teachings of the present disclosure, and the scope of the present disclosure is not limited by these example embodiments.

Figure 1:
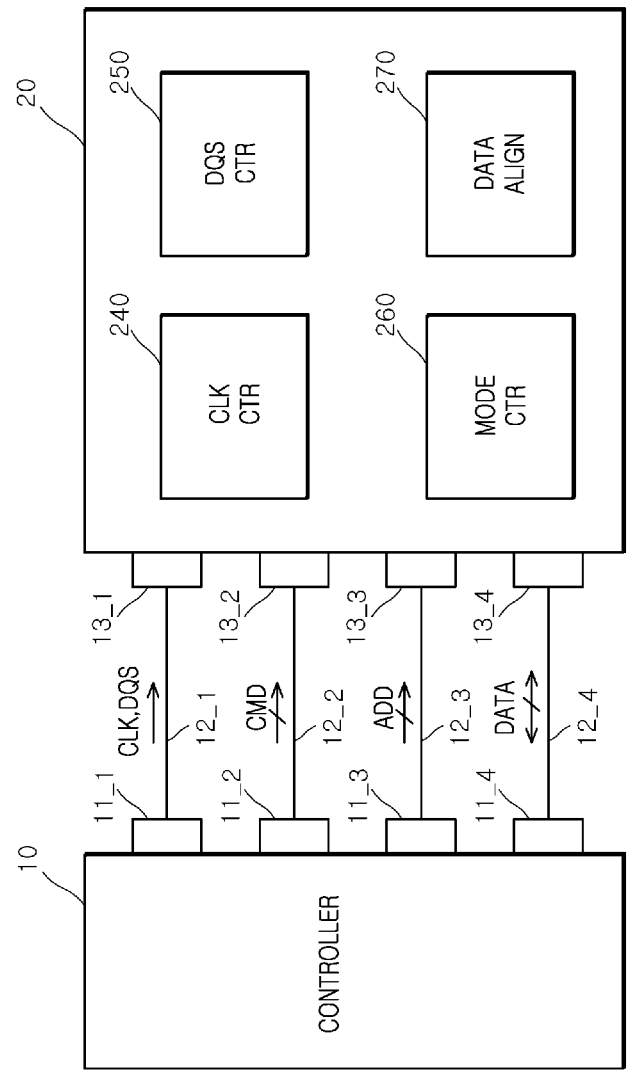
FIG. 1 is a block diagram illustrating an example semiconductor system according to an embodiment of the present disclosure.

FIG. 1 is a block diagram illustrating an example semiconductor system according to an embodiment of the present disclosure. As illustrated in FIG. 1, the semiconductor system 1 may include a controller 10 and a semiconductor device 20. The semiconductor device 20 may include a clock control circuit (CLK CTR) 240, a strobe control circuit (DQS CTR) 250, a mode control circuit (MODE CTR) 260, and a data alignment circuit (DATA ALIGN) 270.

The controller 10 may include a first control pin 11_1, a second control pin 11_2, a third control pin 11_3, and a fourth control pin 11_4. The semiconductor device 20 may include a first device pin 13_1, a second device pin 13_2, a third device pin 13_3, and a fourth device pin 13_4. A first transmission line 12_1 may be connected between the first control pin 11_1 and the first device pin 13_1. A second transmission line 12_2 may be connected between the second control pin 11_2 and the second device pin 13_2. A third transmission line 12_3 may be connected between the third control pin 11_3 and the third device pin 13_3. A fourth transmission line 12_4 may be connected between the fourth control pin 11_4 and the fourth device pin 13_4.

The controller 10 may output a clock CLK and a strobe signal DQS to the semiconductor device 20 through the first transmission line 12_1. The controller 10 may output a command CMD to the semiconductor device 20 through the second transmission line 12_2. The controller 10 may output an address ADD to the semiconductor device 20 through the third transmission line 12_3. The controller 10 may output data DATA to the semiconductor device through the fourth transmission line 12_4, and may receive the data DATA from the semiconductor device 20 through the fourth transmission line 12_4.

The clock CLK may be a periodic signal used to synchronize operations of the controller 10 and the semiconductor device 20. The strobe signal DQS may be a signal that is toggled to strobe the data DATA only for an interval in which the data DATA is input or output. The command CMD may be a set of commands, where each command may be used for controlling an operation of the semiconductor device 20. The address ADD may be used to address one or more memory cells (not illustrated in FIG. 1) in a core circuit (280 in FIG. 2) for enabling the semiconductor device 20 to store and output the data DATA. The data DATA may be provided in a first burst length BL16 after the start of a first operation mode in a write operation. The first burst length BL16 may mean an operation of outputting, by the controller 10, 16-bit data DATA<1:16>. The data DATA may also use a second burst length BL8 after the start of a second operation mode in the write operation. The second burst length BL8 may mean an operation of outputting, by the controller 10, 8-bit data DATA<1:8>. Various embodiments may use different burst lengths with different numbers of bits.

The clock control circuit 240 may generate a latch clock (WL in FIG. 2) by shifting a write signal (WT in FIG. 2) in synchronization with an input clock (IN_CLK in FIG. 2) generated from the clock CLK. The clock control circuit 240 may generate a data pulse signal (DSP in FIG. 2) by shifting the latch clock (WL in FIG. 2) in synchronization with the input clock (IN_CLK in FIG. 2).

The strobe control circuit 250 may generate a first division strobe signal (IDQS in FIG. 2), a second division strobe signal (QDQS in FIG. 2), a third division strobe signal (IBDQS in FIG. 2), and a fourth division strobe signal (QBDQS in FIG. 2) by dividing the frequency of an input strobe signal (IN_DQS in FIG. 2) generated from the strobe signal DQS. The strobe control circuit 250 may generate a first internal strobe signal (DDQS1 in FIG. 2), a second internal strobe signal (DDQS2 in FIG. 2), and a third internal strobe signal (DDQS3 in FIG. 2) for aligning data in the first operation mode and the second operation mode based on the second division strobe signal (QDQS in FIG. 2) and the fourth division strobe signal (QBDQS in FIG. 2).

Figure 2:
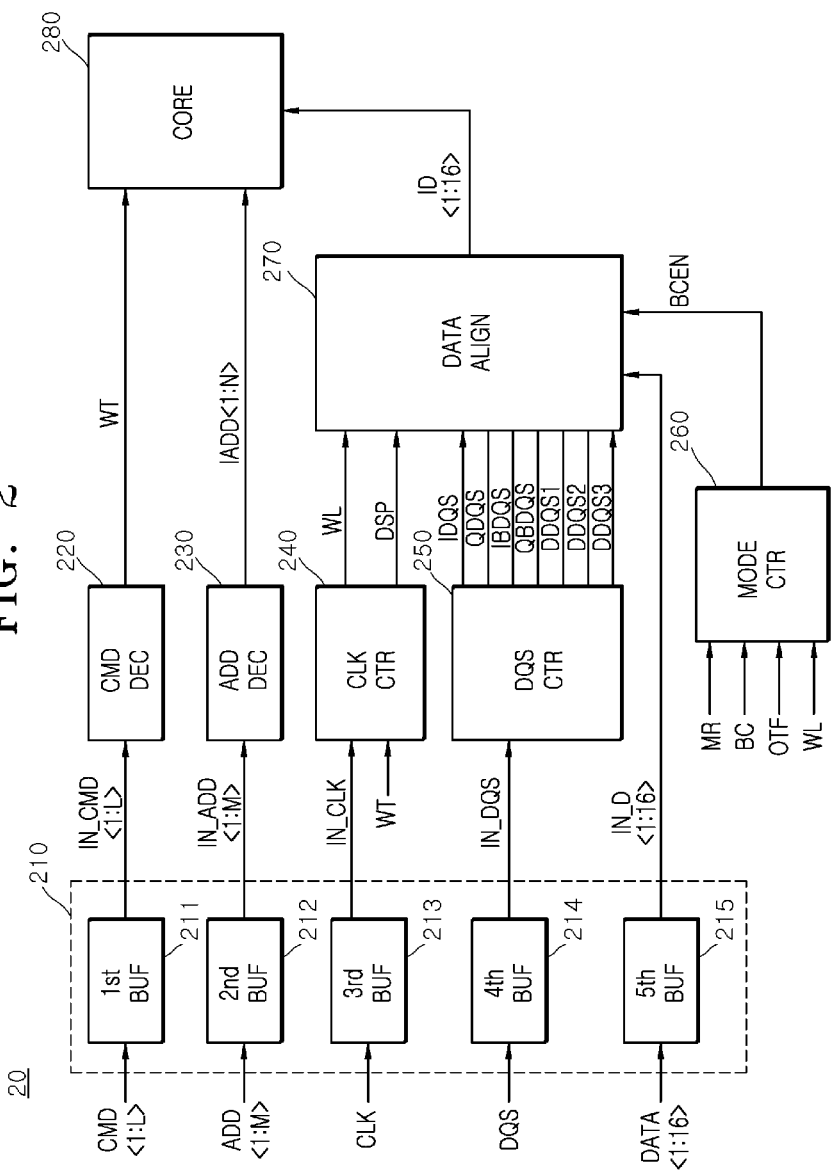
FIG. 2 is a block diagram illustrating an example semiconductor device illustrated in FIG. 1 according to an embodiment of the present disclosure.

The mode control circuit 260 may generate a burst enable signal (BCEN in FIG. 2) that is enabled in the second operation mode, based on a mode register signal (MR in FIG. 2), a burst control signal (BC in FIG. 2), and a mode setting signal (OTF in FIG. 2) for setting the first operation mode and the second operation mode in synchronization with the latch clock (WL in FIG. 2).

The data alignment circuit 270 may align a first group (IN_D<1:8> in FIG. 2) and second group (IN_D<9:16> in FIG. 2) of input data that is generated from the data DATA, in synchronization with the first internal strobe signal (DDQS1 in FIG. 2), the second internal strobe signal (DDQS2 in FIG. 2), and the third internal strobe signal (DDQS3 in FIG. 2). The data alignment circuit 270 may generate internal data (ID<1:16> in FIG. 2) from at least any one of the aligned first group (IN_D<1:8> in FIG. 2) and second group (IN_D<9:16> in FIG. 2) of the input data based on a logic level of the burst enable signal (BCEN in FIG. 2) in synchronization with the latch clock (WL in FIG. 2).

FIG. 2 is a block diagram illustrating an example semiconductor device illustrated in FIG. 1 according to an embodiment of the present disclosure. As illustrated in FIG. 2, the semiconductor device 20 may include a buffer circuit 210, a command decoder (CMD DEC) 220, an address decoder (ADD DEC) 230, the clock control circuit 240, the strobe control circuit 250, the mode control circuit 260, the data alignment circuit 270, and the core circuit (CORE) 280.

The buffer circuit 210 may include a first buffer 211, a second buffer 212, a third buffer 213, a fourth buffer 214, and a fifth buffer 215. The first buffer 211 may generate first to L-th input commands IN_CMD<1:L> by buffering first to L-th commands CMD<1:L>. The second buffer 212 may generate first to M-th input addresses IN_ADD<1:M> by buffering first to M-th addresses ADD<1:M>. The third buffer 213 may generate the input clock IN_CLK by buffering the clock CLK. The fourth buffer 214 may generate the input strobe signal IN_DQS by buffering the strobe signal DQS. The fifth buffer 215 may generate first to sixteenth input data IN_D<1:16> by buffering first to sixteenth data DATA<1:16>.

The command decoder 220 may generate the write signal WT by decoding the first to L-th input commands IN_CMD<1:L>. The command decoder 220 may generate the write signal WT that is enabled when the first to L-th input commands IN_CMD<1:L> is received as a logic level combination for performing a write operation. The command decoder 220 has been implemented to generate the write signal WT, but may be implemented to generate various signals for performing operations, such as read operation, precharge operation, and refresh operation of the semiconductor device 20. The number "L" of bits in the first to L-th commands CMD<1:L> and the first to L-th input commands IN_CMD<1:L> may be a natural number.

The address decoder 230 may generate first to N-th internal addresses IADD<1:N> by decoding the first to M-th input addresses IN_ADD<1:M>. The number "M" of bits in the first to M-th addresses ADD<1:M> and the first to M-th input addresses IN_ADD<1:M> may be natural number. The number "N" of bits in the first to N-th internal addresses IADD<1:N> may be a natural number.

The clock control circuit 240 may generate the latch clock WL and the data pulse signal DSP that are sequentially enabled by shifting the write signal WT in synchronization with the input clock IN_CLK. The clock control circuit 240 may generate the latch clock WL by shifting the write signal WT in synchronization with the input clock IN_CLK. The clock control circuit 240 may generate the data pulse signal DSP by shifting the latch clock WL in synchronization with the input clock IN_CLK. The amount of shifting for generating the latch clock WL and the data pulse signal DSP may be set as various cycles of the input clock IN_CLK.

The strobe control circuit 250 may generate the first division strobe signal IDQS, the second division strobe signal QDQS, the third division strobe signal IBDQS, and the fourth division strobe signal QBDQS by dividing a frequency of the input strobe signal IN_DQS. The strobe control circuit 250 may generate the first division strobe signal IDQS, the second division strobe signal QDQS, the third division strobe signal IBDQS, and the fourth division strobe signal QBDQS having phase differences of 90° therebetween by dividing the frequency of the input strobe signal IN_DQS. The strobe control circuit 250 may generate the first internal strobe signal DDQS1, the second internal strobe signal DDQS2, and the third internal strobe signal DDQS3 for aligning the first to sixteenth data DATA<1:16> in the first operation mode and the second operation mode based on the second division strobe signal QDQS and the fourth division strobe signal QBDQS.

The data alignment circuit 270 may align the first group IN_D<1:8> and second group IN_D<9:16> of the input data in synchronization with the first division strobe signal IDQS, the second division strobe signal QDQS, the third division strobe signal IBDQS, and the fourth division strobe signal QBDQS. The data alignment circuit 270 may align the first group IN_D<1:8> and second group IN_D<9:16> of the input data in synchronization with the first internal strobe signal DDQS1, the second internal strobe signal DDQS2, and the third internal strobe signal DDQS3.

The data alignment circuit 270 may generate the first to sixteenth internal data ID<1:16> from at least any one of the aligned first group IN_D<1:8> and second group IN_D<9:16> of the input data based on a logic level of the burst enable signal BCEN in synchronization with the latch clock WL. The data alignment circuit 270 may perform a domain crossing operation of aligning the first group IN_D<1:8> and second group IN_D<9:16> of the input data in synchronization with the first internal strobe signal DDQS1, the second internal strobe signal DDQS2, and the third internal strobe signal DDQS3 that are generated from the strobe signal DQS and then generating the first to sixteenth internal data ID<1:16> from at least any one of the aligned first group IN_D<1:8> and second group IN_D<9:16> of the input data in synchronization with the latch clock WL that is generated from the clock CLK.

The core circuit 280 may store the first to sixteenth internal data ID<1:16> in a memory cell (not illustrated) that is selected by the write signal WT and the first to N-th internal addresses IADD<1:N>. The core circuit 280 may be implemented as a common memory circuit which includes multiple word lines (not illustrated), multiple bit lines (not illustrated), and multiple memory cells (not illustrated). The memory cells may be provided at locations in which the multiple word lines intersect the multiple bit lines. The core circuit 280 has been implemented to perform a write operation, but may be implemented to perform operations, such as, for example, an active operation, a read operation, a precharge operation, and a refresh operation.

The semiconductor device 20 of the present disclosure may perform a domain crossing operation of aligning the first group DATA<1:8> of data and the second group DATA<9:16> of the data in synchronization with the strobe signal DQS and then generating the first to sixteenth internal data ID<1:16> from the aligned first group DATA<1:8> of the data and the aligned second group DATA<9:16> of the data in synchronization with the clock CLK, in the first operation mode. The semiconductor device 20 may perform a domain crossing operation of aligning the first group DATA<1:8> of the data in synchronization with the strobe signal DQS and generating the first to sixteenth internal data ID<1:16> from the aligned first group DATA<1:8> of the data in synchronization with the clock CLK, in the second operation mode.

Figure 3:
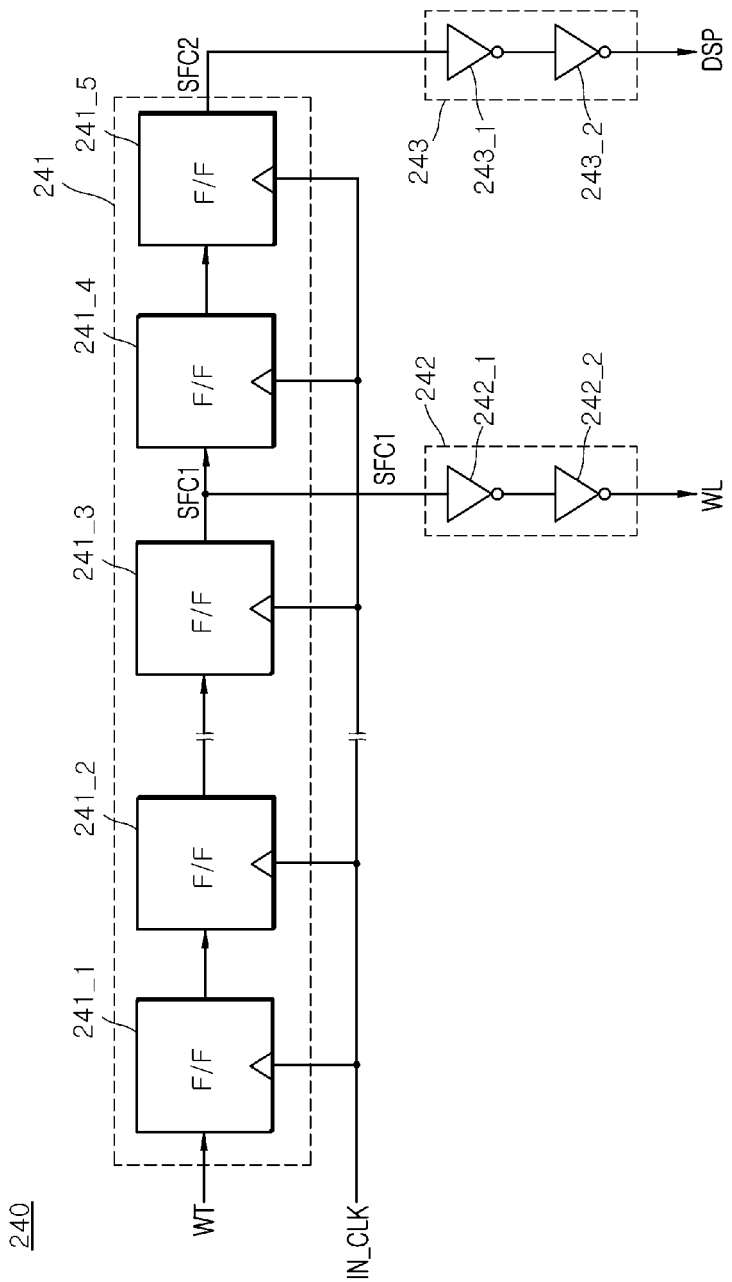
FIG. 3 is a diagram illustrating an example clock control circuit in FIG. 2 according to an embodiment of the present disclosure.

FIG. 3 is a diagram illustrating an example clock control circuit in FIG. 2 according to an embodiment of the present disclosure. As illustrated in FIG. 3, the clock control circuit 240 may include a shifting circuit 241, a latch clock generation circuit 242, and a data pulse signal generation circuit 243.

The shifting circuit 241 may be implemented as multiple flip-flops (F/F) 241_1, 241_2, 241_3, 241_4, and 241_5. The flip-flop 241_1 may latch the write signal WT in synchronization with the input clock IN_CLK. The flip-flop 241_2 may latch the output signal of the flip-flop 241_1 in synchronization with the input clock IN_CLK. The flip-flop 241_3 may latch the output signal of the flip-flop 241_2 in synchronization with the input clock IN_CLK, and may output the latched output signal as a first shifting signal SFC1. The flip-flop 241_4 may latch the first shifting signal SFC1 in synchronization with the input clock IN_CLK. The flip-flop 241_5 may latch the output signal of the flip-flop 241_4 in synchronization with the input clock IN_CLK, and may output the latched output signal as a second shifting signal SFC2. The number of flip-flops included in the shifting circuit 241 may be variously set in different embodiments.

The latch clock generation circuit 242 may be implemented by serially connecting inverters 242_1 and 242_2. The latch clock generation circuit 242 may generate the latch clock WL by buffering the first shifting signal SFC1. The latch clock WL may be generated by shifting the write signal WT by write latency. The amount of a shift for shifting the write signal WT in order to generate the latch clock WL may be variously set in different embodiments.

The data pulse signal generation circuit 243 may be implemented by serially connecting inverters 243_1 and 243_2. The data pulse signal generation circuit 243 may generate the data pulse signal DSP by buffering the second shifting signal SFC2. The data pulse signal DSP may be generated by shifting the first shifting signal SFC1 by two cycles of the input clock IN_CLK, where the first shifting signal SFC1 is buffered by the latch clock generation circuit 242 to be the latch clock WL. The amount of a shift for shifting the latch clock WL in order to generate the data pulse signal DSP may be variously set in different embodiments.

Figure 4:
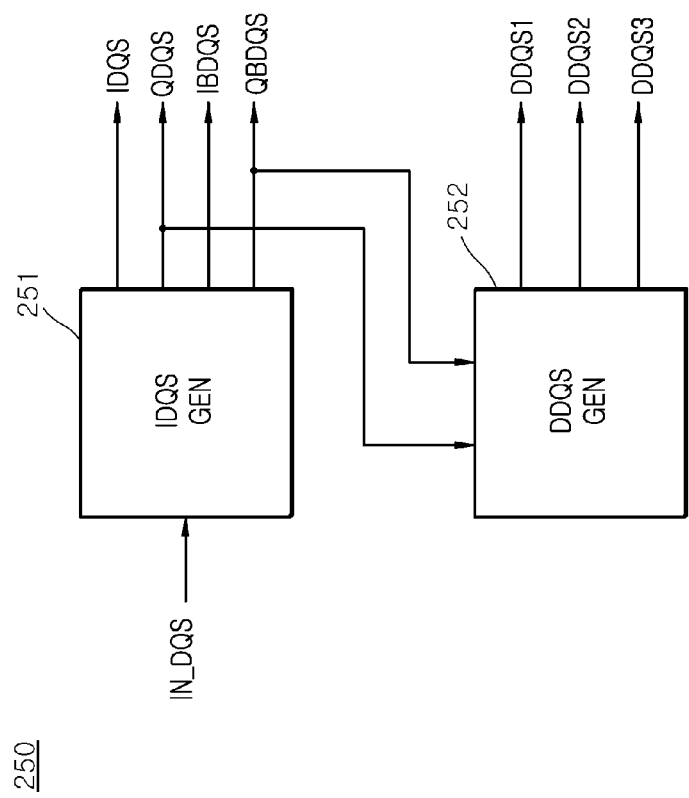
FIG. 4 is a block diagram illustrating an example strobe control circuit in FIG. 2 according to an embodiment of the present disclosure.

FIG. 4 is a block diagram illustrating an example strobe control circuit in FIG. 2 according to an embodiment of the present disclosure. As illustrated in FIG. 4, the strobe control circuit 250 may include a division strobe signal generation circuit (IDQS GEN) 251 and an internal strobe signal generation circuit (DDQS GEN) 252.

The division strobe signal generation circuit 251 may generate the first division strobe signal IDQS, the second division strobe signal QDQS, the third division strobe signal IBDQS, and the fourth division strobe signal QBDQS by dividing a frequency of the input strobe signal IN_DQS. The division strobe signal generation circuit 251 may generate the first division strobe signal IDQS, the second division strobe signal QDQS, the third division strobe signal IBDQS, and the fourth division strobe signal QBDQS having phase differences of 90° therebetween by dividing the frequency of the input strobe signal IN_DQS.

The internal strobe signal generation circuit 252 may generate the first internal strobe signal DDQS1, the second internal strobe signal DDQS2, and the third internal strobe signal DDQS3 for aligning the first to sixteenth data DATA<1:16> in the first operation mode and the second operation mode based on the second division strobe signal QDQS and the fourth division strobe signal QBDQS.

An operation of the strobe control circuit 250 illustrated in FIG. 4 is specifically described with reference to FIG. 5 to be described below.

Figure 5:
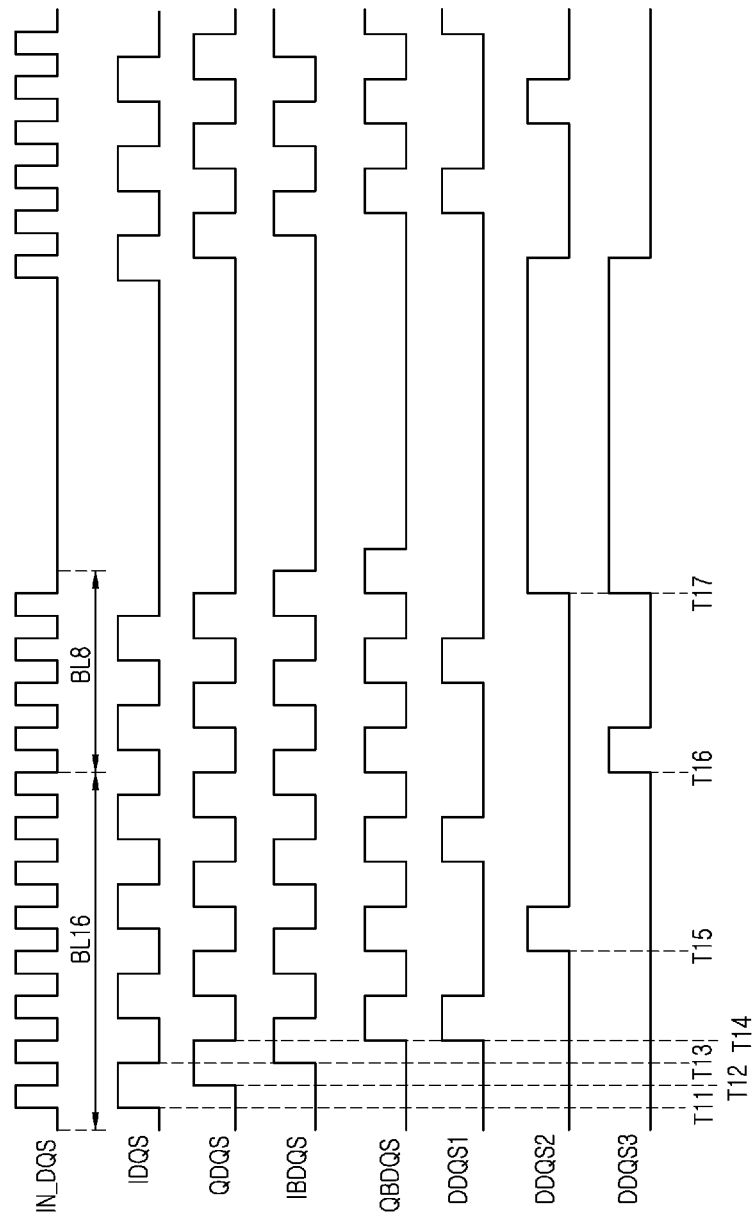
FIG. 5 is a timing diagram for describing an operation of an example strobe control circuit in FIG. 4 according to an embodiment of the present disclosure.

FIG. 5 is a timing diagram for describing an operation of an example strobe control circuit in FIG. 4 according to an embodiment of the present disclosure.

The strobe control circuit 250 may be configured to generate the first division strobe signal IDQS, the second division strobe signal QDQS, the third division strobe signal IBDQS, and the fourth division strobe signal QBDQS and the first internal strobe signal DDQS1, the second internal strobe signal DDQS2, and the third internal strobe signal DDQS3.

The input strobe signal IN_DQS may be initially be at a logic low level, and then may be periodically toggled in the first operation mode (BL16) and the second operation mode (BL8). At the end of the second operation mode (BL8), the input strobe signal IN_DQS may be kept deasserted at the logic low level until the start of the next operation.

At time T11, the division strobe signal generation circuit 251 may generate the first division strobe signal IDQS by dividing a frequency of the input strobe signal IN_DQS that is periodically toggled.

At time T12, the division strobe signal generation circuit 251 may generate the second division strobe signal QDQS by dividing the frequency of the input strobe signal IN_DQS. The second division strobe signal QDQS may have a phase that is 90° behind the phase of the first division strobe signal IDQS.

At time T13, the division strobe signal generation circuit 251 may generate the third division strobe signal IBDQS by dividing the frequency of the input strobe signal IN_DQS. The third division strobe signal IBDQS may have a phase that is 90° behind the phase of the second division strobe signal QDQS.

At time T14, the division strobe signal generation circuit 251 may generate the fourth division strobe signal QBDQS by dividing the frequency of the input strobe signal IN_DQS. The fourth division strobe signal QBDQS may be generated to have a phase that is 90° behind the phase of the third division strobe signal IBDQS.

At time T14, the internal strobe signal generation circuit 252 may generate the first internal strobe signal DDQS1 that has the same pulse as the first pulse of the fourth division strobe signal QBDQS. Thereafter, the internal strobe signal generation circuit 252 may generate the first internal strobe signal DDQS1 to have every other pulse of the fourth division strobe signal QBDQS.

At time T15, the internal strobe signal generation circuit 252 may generate the second internal strobe signal DDQS2 that has the same pulse as the second pulse of the fourth division strobe signal QBDQS.

At time T16, the internal strobe signal generation circuit 252 may generate the third internal strobe signal DDQS3 that has the same pulse as the fourth pulse of the fourth division strobe signal QBDQS.

At time T17, the internal strobe signal generation circuit 252 may generate an extended pulse for each of the second internal strobe signal DDQS2 and the third internal strobe signal DDQS3. The extended pulses may have a logic high level. The extended pulses may have a duration similar to the period during which the input strobe signal IN_DQS is kept deasserted at the logic low level until the start of the next operation. However, the extended pulses may be kept longer at the logic high level since they may be synchronized to the falling edge of the input strobe signal IN_DQS.

Figure 6:
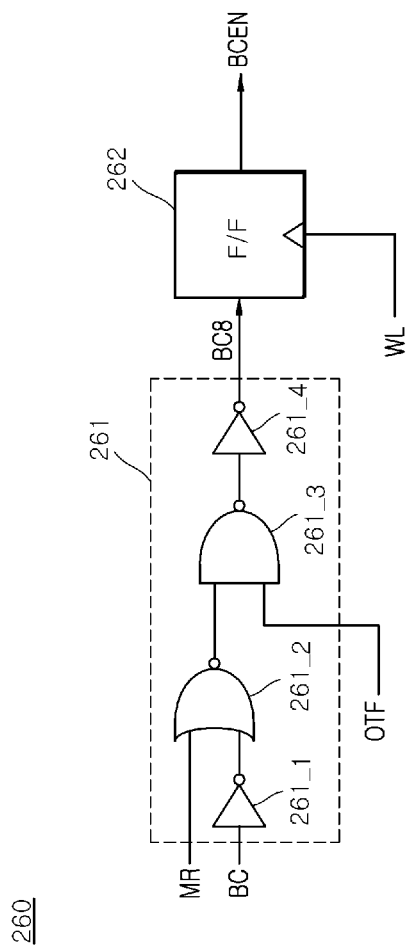
FIG. 6 is a diagram illustrating an example mode control circuit in FIG. 2 according to an embodiment of the present disclosure.

FIG. 6 is a diagram illustrating an example mode control circuit in FIG. 2 according to an embodiment of the present disclosure. As illustrated in FIG. 6, the mode control circuit 260 may include an operation mode signal generation circuit 261 and a burst enable signal generation circuit (F/F) 262.

The operation mode signal generation circuit 261 may be implemented by serially connecting an inverter 261_1, a NOR gate 261_2, an NAND gate 261_3, and an inverter 261_4. When receiving the mode register signal MR having a logic low level, the burst control signal BC having a logic high level, and the mode setting signal OTF having a logic high level, the operation mode signal generation circuit 261 may generate an operation mode signal BC8 having a logic high level to indicate the second operation mode.

The mode register signal MR may be at a logic low level in order to perform the first operation mode and the second operation mode. The burst control signal BC may be at a logic high level in order to perform the second operation mode. The mode setting signal OTF may be at a logic high level in order for the second operation mode to be consecutively performed after the first operation mode is performed.

The burst enable signal generation circuit 262 may be implemented as a flip-flop. The burst enable signal generation circuit 262 may latch the operation mode signal BC8 in synchronization with the latch clock WL, and may output the burst enable signal BCEN. The burst enable signal generation circuit 262 may latch the operation mode signal BC8 when receiving the latch clock WL having a logic high level, and may output the latched operation mode signal BC8 as the burst enable signal BCEN. The burst enable signal generation circuit 262 may generate the burst enable signal BCEN having a logic low level in the first operation mode. The burst enable signal generation circuit 262 may generate the burst enable signal BCEN having a logic high level in the second operation mode.

Figure 7:
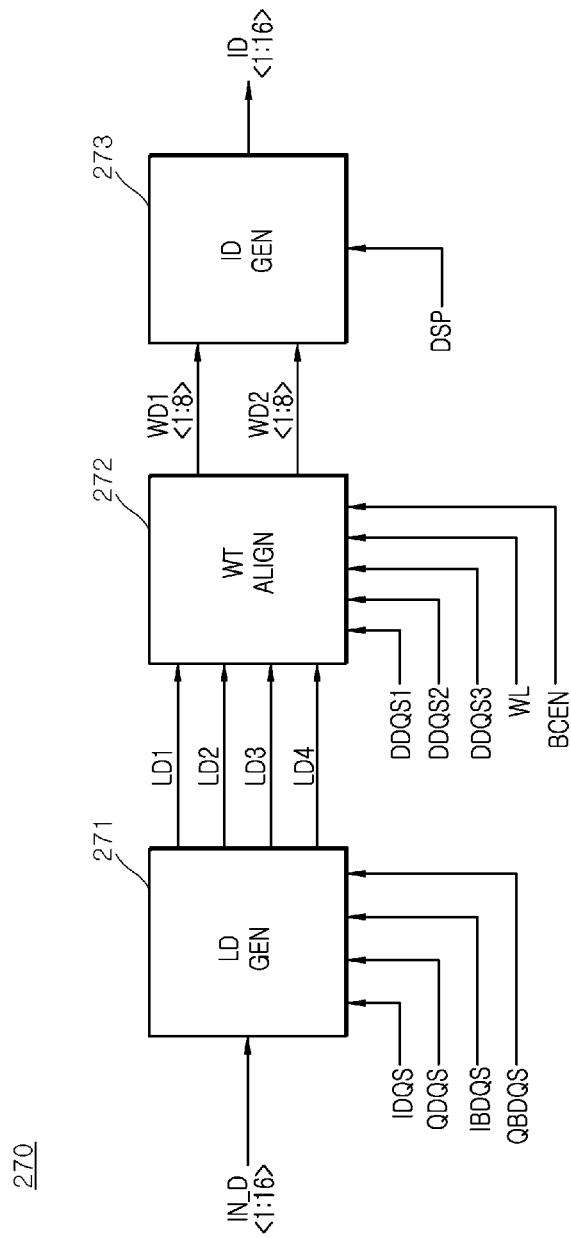
FIG. 7 is a block diagram illustrating an example data alignment circuit in FIG. 2 according to an embodiment of the present disclosure.

FIG. 7 is a block diagram illustrating an example data alignment circuit in FIG. 2 according to an embodiment of the present disclosure. As illustrated in FIG. 7, the data alignment circuit 270 may include a latch data generation circuit (LD GEN) 271, a write alignment circuit (WT ALIGN) 272, and an internal data generation circuit (ID GEN) 273.

The latch data generation circuit 271 may receive the first to sixteenth input data IN_D<1:16> in synchronization with the first division strobe signal IDQS, the second division strobe signal QDQS, the third division strobe signal IBDQS, and the fourth division strobe signal QBDQS. The latch data generation circuit 271 may generate first latch data LD1, second latch data LD2, third latch data LD3, and fourth latch data LD4 from the first to sixteenth input data IN_D<1:16> in synchronization with the first division strobe signal IDQS, the second division strobe signal QDQS, the third division strobe signal IBDQS, and the fourth division strobe signal QBDQS.

The first latch data LD1 may be generated by serially latching the first, fifth, ninth, and thirteenth input data IN_D<1,5,9,13>. The second latch data LD2 may be generated by serially latching the second, sixth, tenth, and fourteenth input data IN_D<2,6,10,14>. The third latch data LD3 may be generated by serially latching the third, seventh, eleventh, and fifteenth input data IN_D<3,7,11,15>. The fourth latch data LD4 may be generated by serially latching the fourth, eighth, twelfth, and sixteenth input data IN_D<4,8,12,16>.

The write alignment circuit 272 may align bits that are included in the first latch data LD1, the second latch data LD2, the third latch data LD3, and the fourth latch data LD4, in synchronization with the first internal strobe signal DDQS1, the second internal strobe signal DDQS2, and the third internal strobe signal DDQS3. The write alignment circuit 272 may generate first write data WD1<1:8> and second write data WD2<1:8> from the aligned bits, which are included in the first latch data LD1, second latch data LD2, third latch data LD3, and fourth latch data LD4, based on a logic level of the burst enable signal BCEN in synchronization with the latch clock WL.

The internal data generation circuit 273 may generate the first to sixteenth internal data ID<1:16> from the first write data WD1<1:8> and the second write data WD2<1:8> in synchronization with the data pulse signal DSP. The internal data generation circuit 273 may generate first to eighth internal data ID<1:8> from the first write data WD1<1:8> in synchronization with the data pulse signal DSP. The internal data generation circuit 273 may generate ninth to sixteenth internal data ID<9:16> from the second write data WD2<1:8> in synchronization with the data pulse signal DSP.

Figure 8:
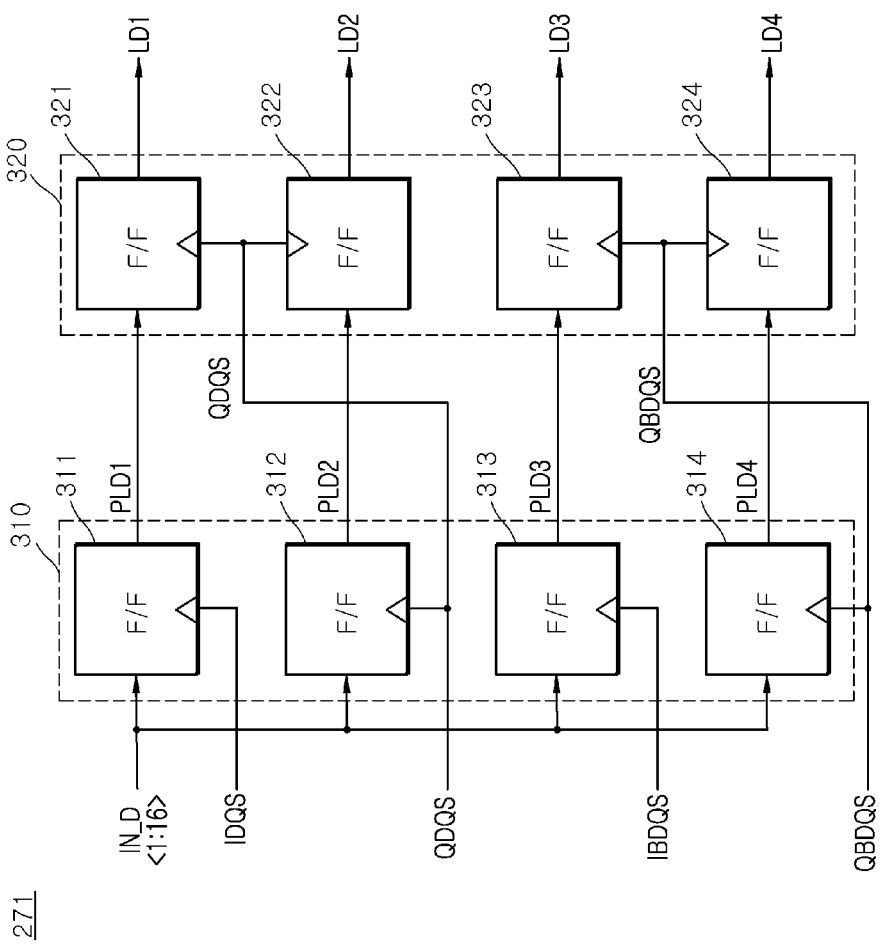
FIG. 8 is a block diagram illustrating an example latch data generation circuit in FIG. 7 according to an embodiment of the present disclosure.

FIG. 8 is a block diagram illustrating an example latch data generation circuit in FIG. 7 according to an embodiment of the present disclosure. As illustrated in FIG. 8, the latch data generation circuit 271 may include a pre-latch data generation circuit 310 and a latch data output circuit 320.

The pre-latch data generation circuit 310 may be implemented as flip-flops (F/F) 311, 312, 313, and 314. The flip-flop 311 may generate first pre-latch data PLD1 by serially latching the first, fifth, ninth, and thirteenth input data IN_D<1,5,9,13> that are received at a rising edge of the first division strobe signal IDQS. The flip-flop 312 may generate second pre-latch data PLD2 by serially latching the second, sixth, tenth, and fourteenth input data IN_D<2,6,10,14> that are received at a rising edge of the second division strobe signal QDQS. The flip-flop 313 may generate third pre-latch data PLD3 by serially latching the third, seventh, eleventh, and fifteenth input data IN_D<3,7,11,15> that are received at a rising edge of the third division strobe signal IBDQS. The flip-flop 314 may generate fourth pre-latch data PLD4 by serially latching the fourth, eighth, twelfth, and sixteenth input data IN_D<4,8,12,16> that are received at a rising edge of the fourth division strobe signal QBDQS.

The latch data output circuit 320 may be implemented as flip-flops (F/F) 321, 322, 323, and 324. The flip-flop 321 may latch the received first pre-latch data PLD1 at a rising edge of the second division strobe signal QDQS, and may output the latched first pre-latch data PLD1 as the first latch data LD1. The flip-flop 322 may latch the received second pre-latch data PLD2 at a rising edge of the second division strobe signal QDQS, and may output the latched second pre-latch data PLD2 as the second latch data LD2. The flip-flop 323 may latch the received third pre-latch data PLD3 at a rising edge of the fourth division strobe signal QBDQS, and may output the latched third pre-latch data PLD3 as the third latch data LD3. The flip-flop 324 may latch the received fourth pre-latch data PLD4 at a rising edge of the fourth division strobe signal QBDQS, and may output the latched fourth pre-latch data PLD4 as the fourth latch data LD4.

Figure 9:
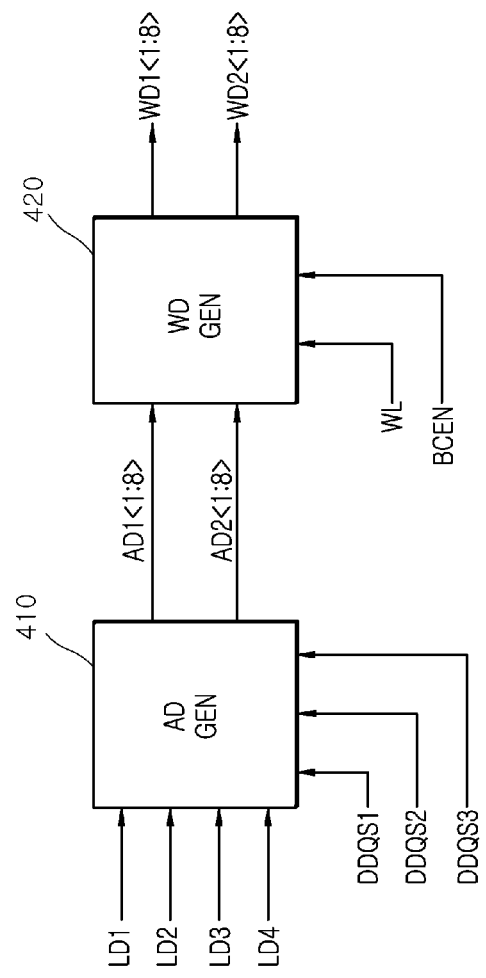
FIG. 9 is a block diagram illustrating an example write alignment circuit in FIG. 7 according to an embodiment of the present disclosure.

FIG. 9 is a block diagram illustrating an example write alignment circuit in FIG. 7 according to an embodiment of the present disclosure. As illustrated in FIG. 9, the write alignment circuit 272 may include an alignment data generation circuit (AD GEN) 410 and a write data generation circuit (WD GEN) 420.

The alignment data generation circuit 410 may align bits included in the first latch data LD1, the second latch data LD2, the third latch data LD3, and the fourth latch data LD4 in synchronization with the first internal strobe signal DDQS1, the second internal strobe signal DDQS2, and the third internal strobe signal DDQS3. The alignment data generation circuit 410 may generate first alignment data AD1<1:8> and second alignment data AD2<1:8> from the aligned first latch data LD1, second latch data LD2, third latch data LD3, and fourth latch data LD4 in synchronization with the first internal strobe signal DDQS1, the second internal strobe signal DDQS2, and the third internal strobe signal DDQS3.

The write data generation circuit 420 may generate the first write data WD1<1:8> and the second write data WD2<1:8> from the first alignment data AD1<1:8> and the second alignment data AD2<1:8> based on a logic level of the burst enable signal BCEN in synchronization with the latch clock WL. The write data generation circuit 420 may generate the first write data WD1<1:8> and the second write data WD2<1:8> from the first alignment data AD1<1:8> and the second alignment data AD2<1:8>, based on the logic level of the burst enable signal BCEN in synchronization with the latch clock WL in the first operation mode. The write data generation circuit 420 may generate the first write data WD1<1:8> and the second write data WD2<1:8> from the first alignment data AD1<1:8> based on a logic level of the burst enable signal BCEN in synchronization with the latch clock WL in the second operation mode.

Figure 10:
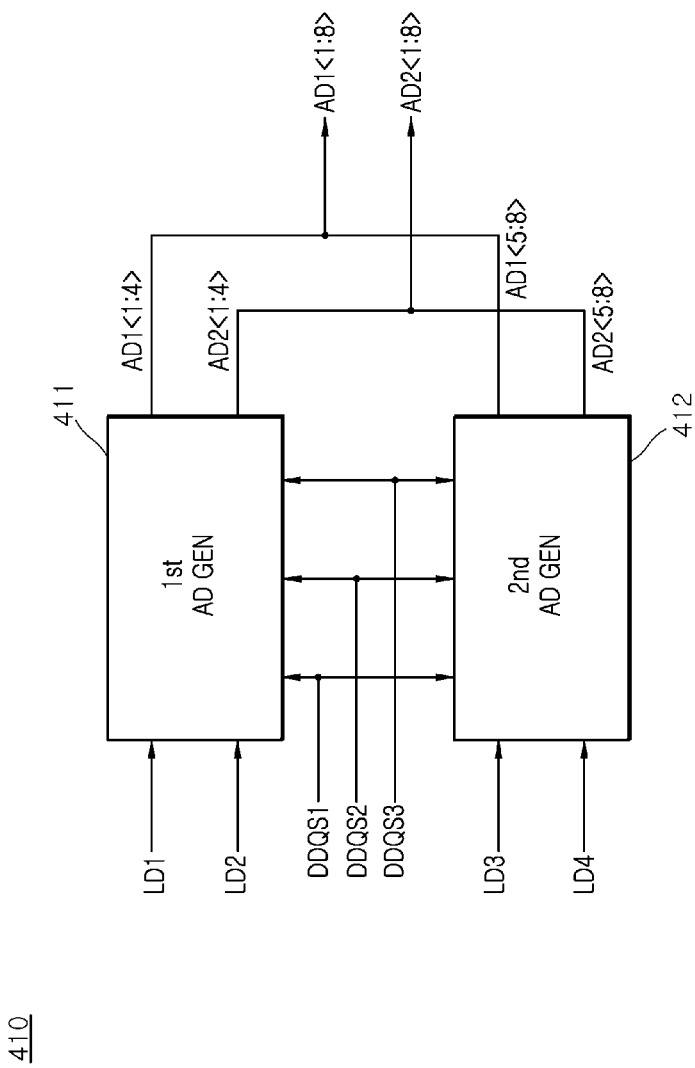
FIG. 10 is a block diagram illustrating an example alignment data generation circuit illustrated in FIG. 9 according to an embodiment of the present disclosure.

FIG. 10 is a block diagram illustrating an example alignment data generation circuit illustrated in FIG. 9 according to an embodiment of the present disclosure. As illustrated in FIG. 10, the alignment data generation circuit 410 may include a first alignment data generation circuit (1$^{st}$ AD GEN) 411 and a second alignment data generation circuit (2$^{nd}$ AD GEN) 412.

The first alignment data generation circuit 411 may receive the first latch data LD1 and the second latch data LD2 in synchronization with the first internal strobe signal DDQS1. The first alignment data generation circuit 411 may generate first to fourth bits AD1<1:4> of the first alignment data and first to fourth bits AD2<1:4> of the second alignment data from the first latch data LD1 and the second latch data LD2 in synchronization with the second internal strobe signal DDQS2 and the third internal strobe signal DDQS3.

The second alignment data generation circuit 412 may receive the third latch data LD3 and the fourth latch data LD4 in synchronization with the first internal strobe signal DDQS1. The second alignment data generation circuit 412 may generate fifth to eighth bits AD1<5:8> of the first alignment data and the fifth to eighth bits AD2<5:8> of the second alignment data from the third latch data LD3 and the fourth latch data LD4 in synchronization with the second internal strobe signal DDQS2 and the third internal strobe signal DDQS3.

Figure 11:
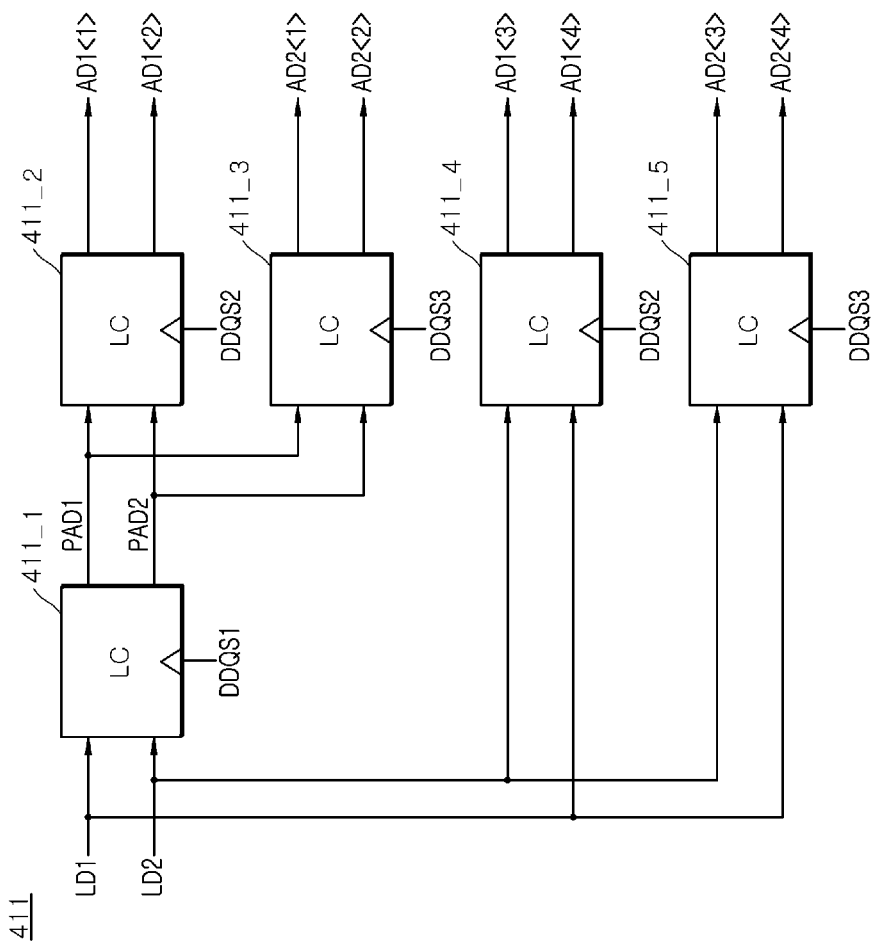
FIG. 11 is a block diagram illustrating an example first alignment data generation circuit illustrated in FIG. 10 according to an embodiment of the present disclosure.

FIG. 11 is a block diagram illustrating an example first alignment data generation circuit illustrated in FIG. 10 according to an embodiment of the present disclosure. As illustrated in FIG. 11, the first alignment data generation circuit 411 may include a first latch (LC) 411_1, second latch (LC) 411_2, a third latch (LC) 411_3, a fourth latch (LC) 411_4, and a fifth latch (LC) 411_5.

The first latch 411_1 may generate first pre-alignment data PAD1 by latching the first latch data LD1 in synchronization with the first internal strobe signal DDQS1. The first latch 411_1 may generate second pre-alignment data PAD2 by latching the second latch data LD2 in synchronization with the first internal strobe signal DDQS1.

The second latch 411_2 may generate the first bit AD1<1> of the first alignment data by latching the first pre-alignment data PAD1 in synchronization with the second internal strobe signal DDQS2. The second latch 411_2 may generate the second bit AD1<2> of the first alignment data by latching the second pre-alignment data PAD2 in synchronization with the second internal strobe signal DDQS2.

The third latch 411_3 may generate the first bit AD2<1> of the second alignment data by latching the first pre-alignment data PAD1 in synchronization with the third internal strobe signal DDQS3. The third latch 411_3 may generate the second bit AD2<2> of the second alignment data by latching the second pre-alignment data PAD2 in synchronization with the third internal strobe signal DDQS3.

The fourth latch 411_4 may generate the third bit AD1<3> of the first alignment data by latching the first latch data LD1 in synchronization with the second internal strobe signal DDQS2. The fourth latch 411_4 may generate the fourth bit AD1<4> of the first alignment data by latching the second latch data LD2 in synchronization with the second internal strobe signal DDQS2.

The fifth latch 411_5 may generate the third bit AD2<3> of the second alignment data by latching the first latch data LD1 in synchronization with the third internal strobe signal DDQS3. The fifth latch 411_5 may generate the fourth bit AD2<4> of the second alignment data by latching the second latch data LD2 in synchronization with the third internal strobe signal DDQS3.

Figure 12:
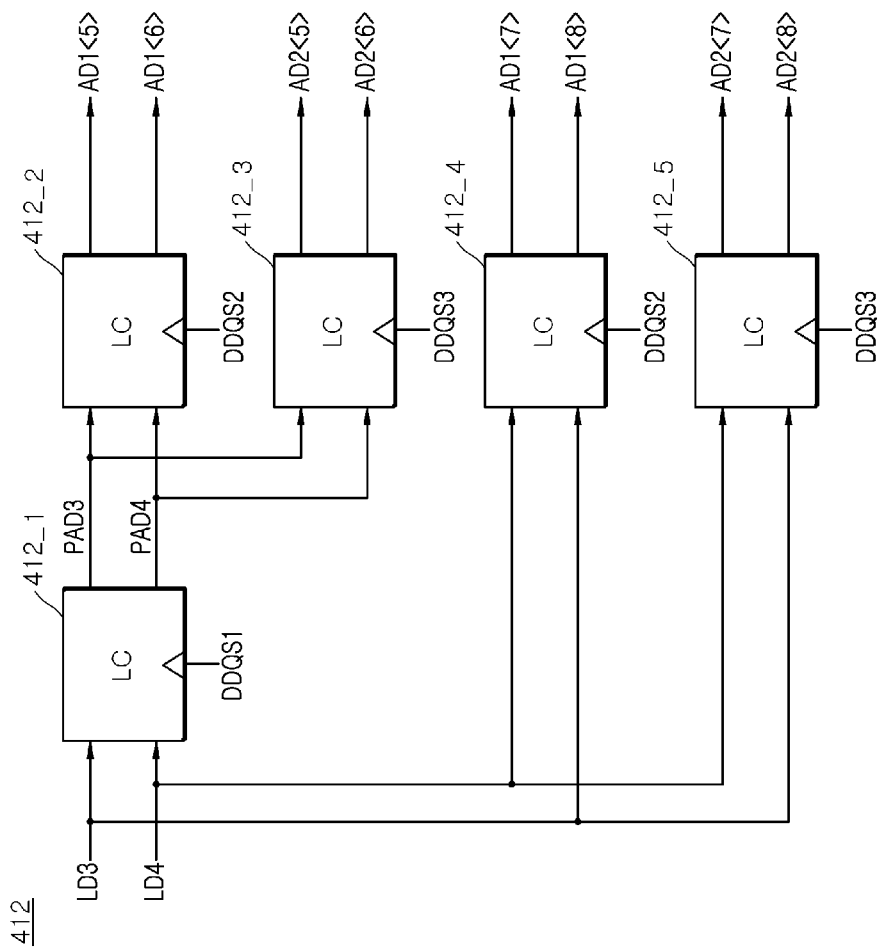
FIG. 12 is a block diagram illustrating an example second alignment data generation circuit illustrated in FIG. 10 according to an embodiment of the present disclosure.

FIG. 12 is a block diagram illustrating an example second alignment data generation circuit illustrated in FIG. 10 according to an embodiment of the present disclosure. As illustrated in FIG. 12, the second alignment data generation circuit 412 may include a sixth latch (LC) 412_1, a seventh latch (LC) 412_2, an eighth latch (LC) 412_3, a ninth latch (LC) 412_4, and a tenth latch (LC) 412_5.

The sixth latch 412_1 may generate third pre-alignment data PAD3 by latching the third latch data LD3 in synchronization with the first internal strobe signal DDQS1. The sixth latch 412_1 may generate fourth pre-alignment data PAD4 by latching the fourth latch data LD4 in synchronization with the first internal strobe signal DDQS1.

The seventh latch 412_2 may generate the fifth bit AD1<5> of the first alignment data by latching the third pre-alignment data PAD3 in synchronization with the second internal strobe signal DDQS2. The seventh latch 412_2 may generate the sixth bit AD1<6> of the first alignment data by latching the fourth pre-alignment data PAD4 in synchronization with the second internal strobe signal DDQS2.

The eighth latch 412_3 may generate the fifth bit AD2<5> of the second alignment data by latching the third pre-alignment data PAD3 in synchronization with the third internal strobe signal DDQS3. The eighth latch 412_3 may generate the sixth bit AD2<6> of the second alignment data by latching the fourth pre-alignment data PAD4 in synchronization with the third internal strobe signal DDQS3.

The ninth latch 412_4 may generate the seventh bit AD1<7> of the first alignment data by latching the third latch data LD3 in synchronization with the second internal strobe signal DDQS2. The ninth latch 412_4 may generate the eighth bit AD1<8> of the first alignment data by latching the fourth latch data LD4 in synchronization with the second internal strobe signal DDQS2.

The tenth latch 412_5 may generate the seventh bit AD2<7> of the second alignment data by latching the third latch data LD3 in synchronization with the third internal strobe signal DDQS3. The tenth latch 412_5 may generate the eighth bit AD2<8> of the second alignment data by latching the fourth latch data LD4 in synchronization with the third internal strobe signal DDQS3.

Figure 13:
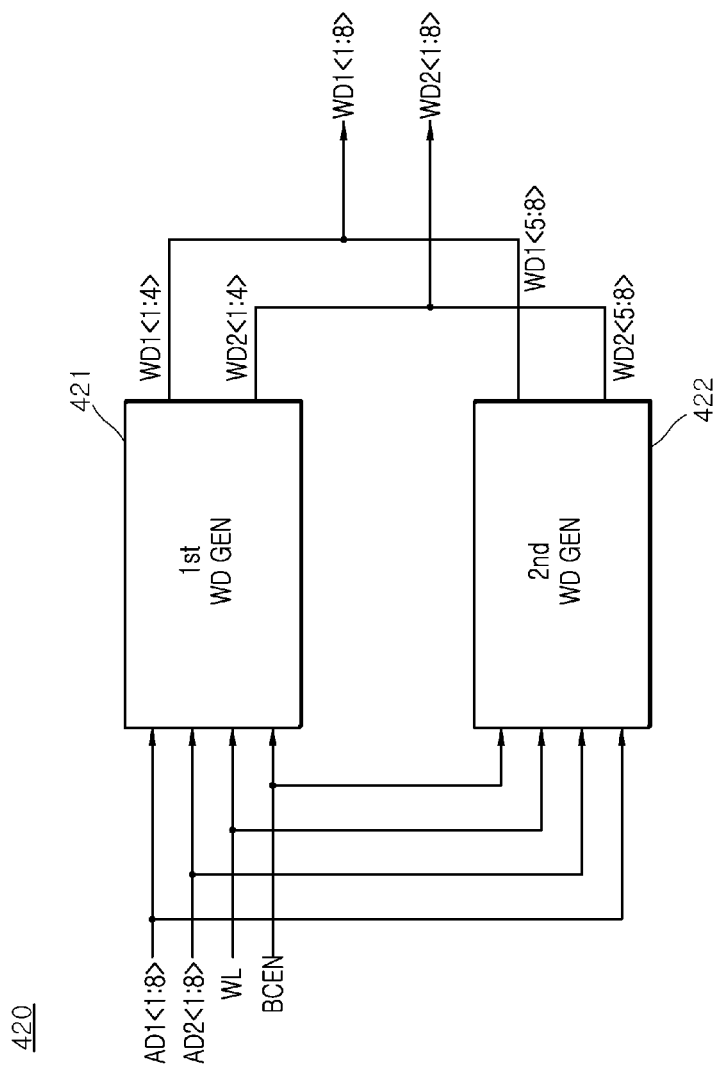
FIG. 13 is a block diagram illustrating an example write data generation circuit illustrated in FIG. 9 according to an embodiment of the present disclosure.

FIG. 13 is a block diagram illustrating an example write data generation circuit illustrated in FIG. 9 according to an embodiment of the present disclosure. As illustrated in FIG. 13, the write data generation circuit 420 may include a first write data generation circuit (1$^{st}$ WD GEN) 421 and a second write data generation circuit (2$^{nd}$ WD GEN) 422.

The first write data generation circuit 421 may generate first to fourth bits WD1<1:4> of the first write data and first to fourth bits WD2<1:4> of the second write data from the first to fourth bits AD1<1:4> of the first alignment data and the first to fourth bits AD2<1:4> of the second alignment data, respectively. These bits may be generated based on a logic level of the burst enable signal BCEN in synchronization with the latch clock WL in the first operation mode or the second operation mode.

The second write data generation circuit 422 may generate fifth to eighth bits WD1<5:8> of the first write data and fifth to eighth bits WD2<5:8> of the second write data from the fifth to eighth bits AD1<5:8> of the first alignment data and the fifth to eighth bits AD2<5:8> of the second alignment data, respectively. These bits may be generated based on a logic level of the burst enable signal BCEN in synchronization with the latch clock WL in the first operation mode or the second operation mode.

Figure 14:
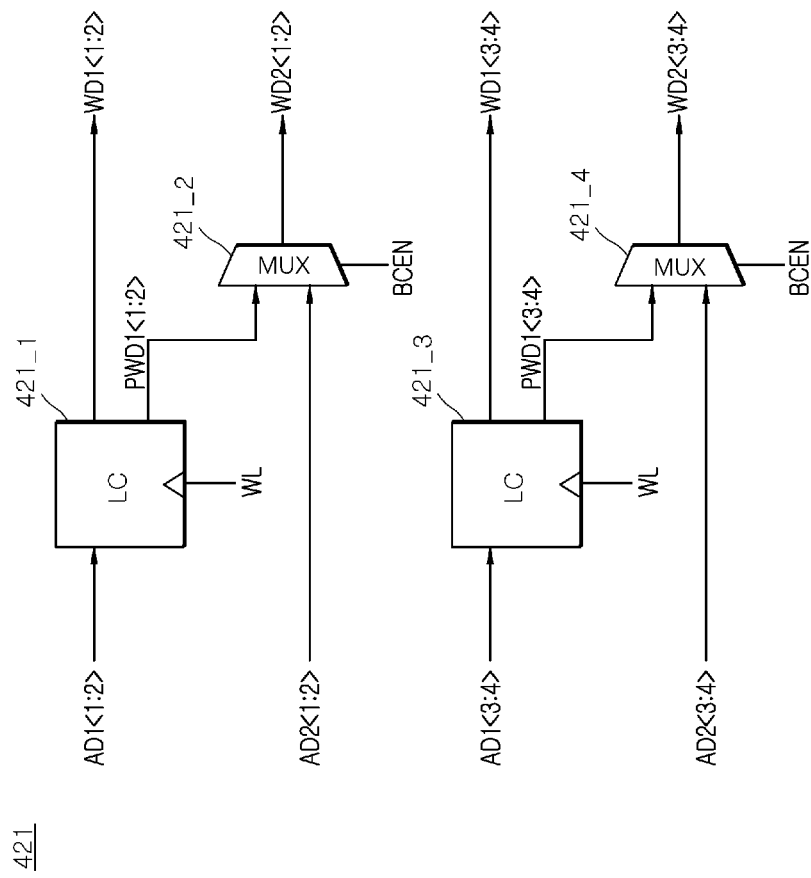
FIG. 14 is a block diagram illustrating an example first write data generation circuit illustrated in FIG. 13 according to an embodiment of the present disclosure.

FIG. 14 is a block diagram illustrating an example first write data generation circuit illustrated in FIG. 13 according to an embodiment of the present disclosure. As illustrated in FIG. 14, the first write data generation circuit 421 may include an eleventh latch (LC) 421_1, a first selection transfer circuit (MUX) 421_2, a twelfth latch (LC) 421_3, and a second selection transfer circuit (MUX) 421_4.

The eleventh latch 421_1 may generate first and second bits WD1<1:2> of the first write data by latching first and second bits AD1<1:2> of the first alignment data in synchronization with the latch clock WL. The eleventh latch 421_1 may generate first and second bits PWD1<1:2> of first pre-write data by latching the first and second bits AD1<1:2> of the first alignment data in synchronization with the latch clock WL.

The first selection transfer circuit 421_2 may generate first and second bits WD2<1:2> of the second write data from the first and second bits AD2<1:2> of the second alignment data when the level of the burst enable signal BCEN is disabled to a logic low level in the first operation mode. The first selection transfer circuit 421_2 may generate the first and second bits WD2<1:2> of the second write data from the first and second bits PWD1<1:2> of the first pre-write data when the level of the burst enable signal BCEN is enabled to a logic high level in the second operation mode.

The twelfth latch 421_3 may generate third and fourth bits WD1<3:4> of the first write data by latching third and fourth bits AD1<3:4> of the first alignment data in synchronization with the latch clock WL. The twelfth latch 421_3 may generate third and fourth bits PWD1<3:4> of the first pre-write data by latching the third and fourth bits AD1<3:4> of the first alignment data in synchronization with the latch clock WL.

The second selection transfer circuit 421_4 may generate third and fourth bits WD2<3:4> of the second write data from third and fourth bits AD2<3:4> of the second alignment data when the level of the burst enable signal BCEN is disabled to a logic low level in the first operation mode. The second selection transfer circuit 421_4 may generate the third and fourth bits WD2<3:4> of the second write data from the third and fourth bits PWD1<3:4> of the first pre-write data when the level of the burst enable signal BCEN is enabled to a logic high level in the second operation mode.

Figure 15:
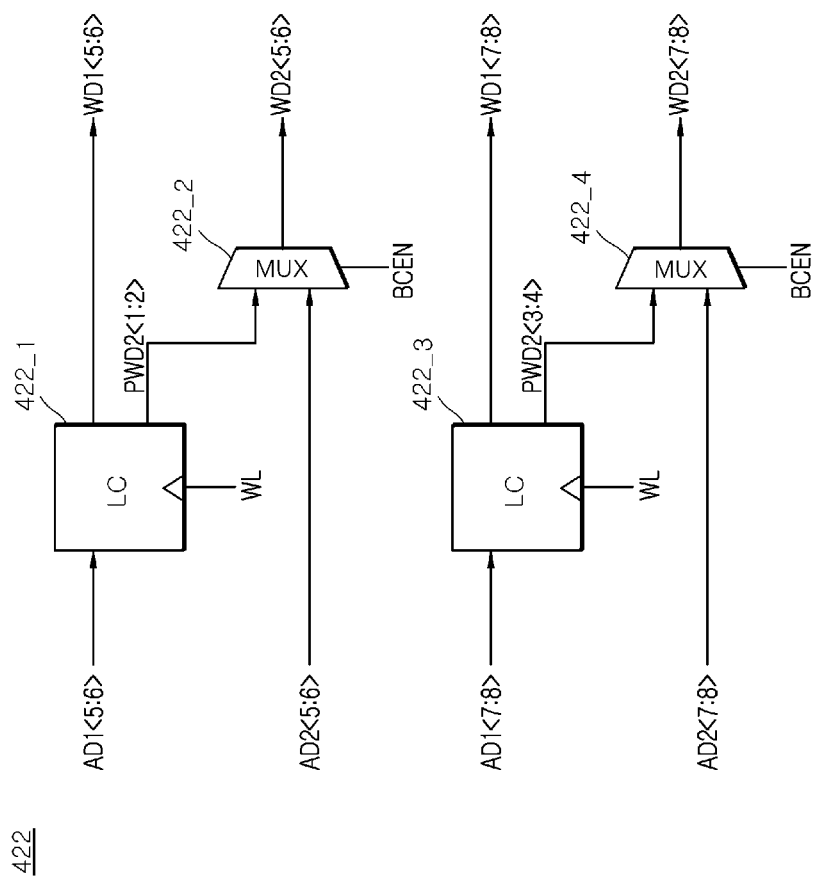
FIG. 15 is a block diagram illustrating an example second write data generation circuit illustrated in FIG. 13 according to an embodiment of the present disclosure.

FIG. 15 is a block diagram illustrating an example second write data generation circuit illustrated in FIG. 13 according to an embodiment of the present disclosure. As illustrated in FIG. 15, the second write data generation circuit 422 may include a thirteenth latch (LC) 422_1, a third selection transfer circuit (MUX) 422_2, a fourteenth latch (LC) 422_3, and a fourth selection transfer circuit (MUX) 422_4.

The thirteenth latch 422_1 may generate fifth and sixth bits WD1<5:6> of the first write data by latching fifth and sixth bits AD1<5:6> of the first alignment data in synchronization with the latch clock WL. The thirteenth latch 422_1 may generate first and second bits PWD2<1:2> of second pre-write data by latching the fifth and sixth bits AD1<5:6> of the first alignment data in synchronization with the latch clock WL.

The third selection transfer circuit 422_2 may generate fifth and sixth bits WD2<5:6> of the second write data from fifth and sixth bits AD2<5:6> of the second alignment data when the level of the burst enable signal BCEN is disabled to a logic low level in the first operation mode. The third selection transfer circuit 422_2 may generate the fifth and sixth bits WD2<5:6> of the second write data from the first and second bits PWD2<1:2> of the second pre-write data when the level of the burst enable signal BCEN is enabled to a logic high level in the second operation mode.

The fourteenth latch 422_3 may generate seventh and eighth bits WD1<7:8> of the first write data by latching seventh and eighth bits AD1<7:8> of the first alignment data in synchronization with the latch clock WL. The fourteenth latch 422_3 may generate third and fourth bits PWD2<3:4> of the second pre-write data by latching the seventh and eighth bits AD1<7:8> of the first alignment data in synchronization with the latch clock WL.

The fourth selection transfer circuit 422_4 may generate seventh and eighth bits WD2<7:8> of the second write data from seventh and eighth bits AD2<7:8> of the second alignment data when the level of the burst enable signal BCEN is disabled to a logic low level in the first operation mode. The fourth selection transfer circuit 422_4 may generate the seventh and eighth bits WD2<7:8> of the second write data from the third and fourth bits PWD1<3:4> of the second pre-write data when the level of the burst enable signal BCEN is enabled to a logic high level in the second operation mode.

Figure 16:
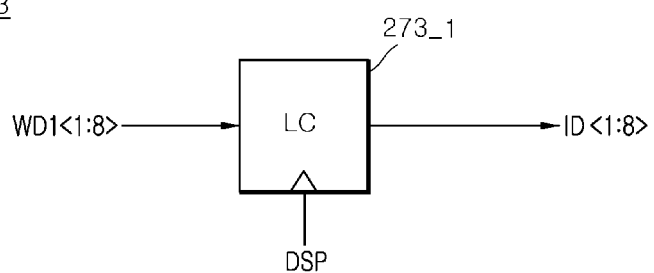
FIG. 16 is a block diagram illustrating an example internal data generation circuit illustrated in FIG. 7 according to an embodiment of the present disclosure.
Figure 16:
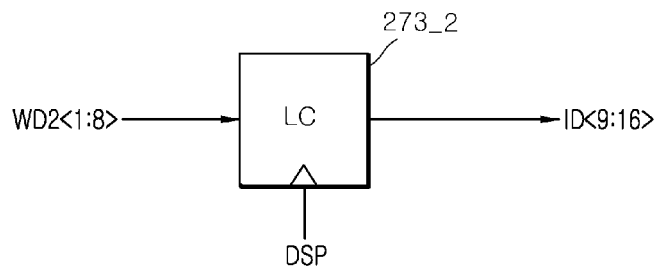

FIG. 16 is a block diagram illustrating an example internal data generation circuit illustrated in FIG. 7 according to an embodiment of the present disclosure. As illustrated in FIG. 16, the internal data generation circuit 273 may include a fifteenth latch (LC) 273_1 and a sixteenth latch (LC) 273_2.

The fifteenth latch 273_1 may generate the first to eighth internal data ID<1:8> by latching the first write data WD1<1:8> in synchronization with the data pulse signal DSP.

The sixteenth latch 273_2 may generate the ninth to sixteenth internal data ID<9:16> by latching the second write data WD2<1:8> in synchronization with the data pulse signal DSP.

A data alignment operation of the semiconductor system according to an embodiment of the present disclosure is described with reference to FIGS. 17 to 19, but a case where the first operation mode and the second operation mode are consecutively performed is described as an example as follows.

Figure 17:
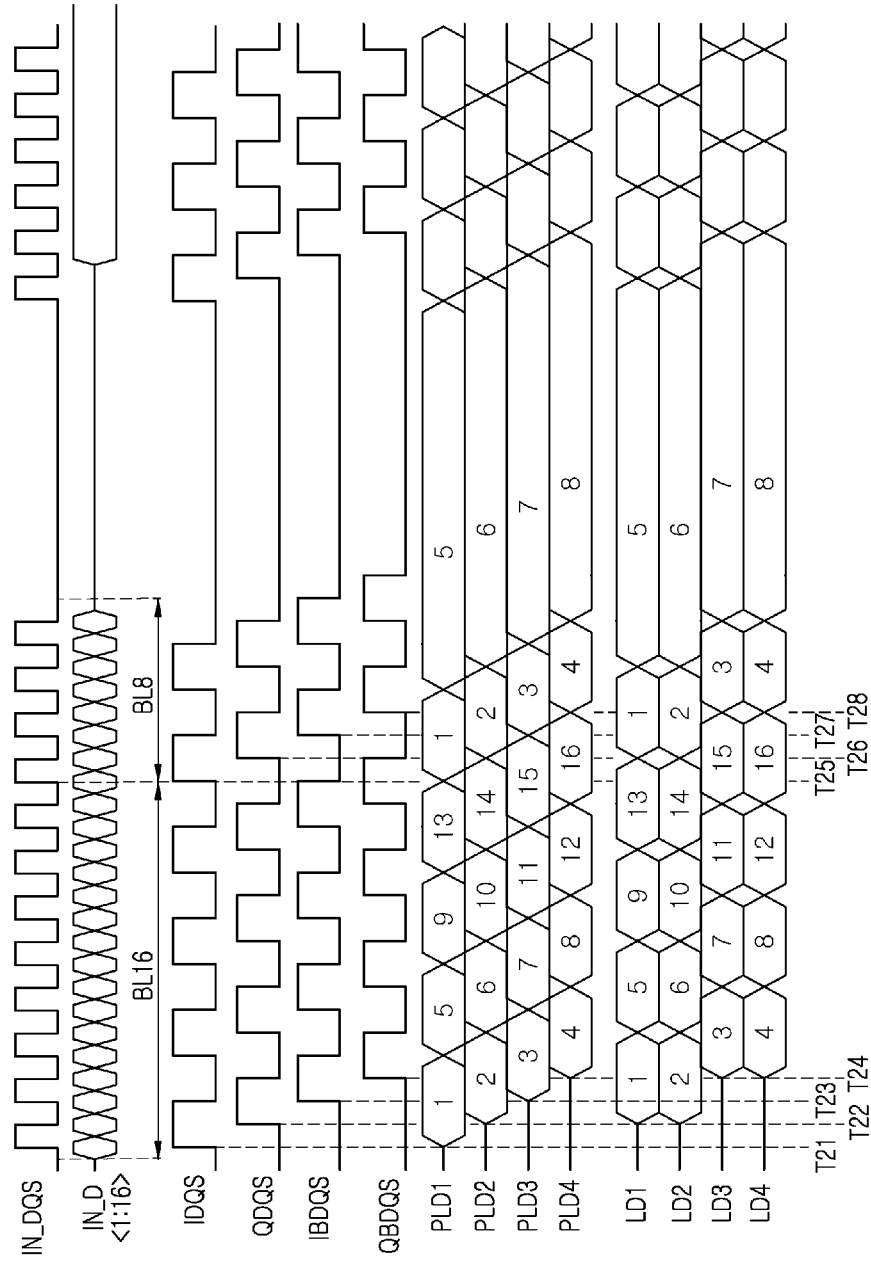
FIGS. 17 to 19 are timing diagrams describing example data alignment operation according to embodiments of the present disclosure.

FIG. 17 is a timing diagram describing example data alignment operation of the semiconductor system according to an embodiment of the present disclosure.

An operation of generating the first latch data LD1, the second latch data LD2, the third latch data LD3, and the fourth latch data LD4 from the first to sixteenth input data IN_D<1:16> when the first operation mode and the second operation mode are consecutively performed is described as follows with reference to FIG. 17.

The input strobe signal IN_DQS is toggled for strobing input data only for an interval in which the data is input. In the first operation mode, the length of input data may be set as the burst length 16 (BL16), and the first to sixteenth input data IN_D<1:16> are serially received.

At time T21, the division strobe signal generation circuit 251 may generate the first division strobe signal IDQS by dividing a frequency of the input strobe signal IN_DQS.

The pre-latch data generation circuit 310 may generate the first pre-latch data PLD1 by latching the received first input data IN_D<1> at a rising edge of the first division strobe signal IDQS.

At time T22, the division strobe signal generation circuit 251 may generate the second division strobe signal QDQS by dividing the frequency of the input strobe signal IN_DQS.

The pre-latch data generation circuit 310 may generate the second pre-latch data PLD2 by latching the received second input data IN_D<2> at a rising edge of the second division strobe signal QDQS.

The latch data output circuit 320 may latch the received first pre-latch data PLD1 at a rising edge of the second division strobe signal QDQS, and may output the latched first pre-latch data PLD1 as the first latch data LD1. The latch data output circuit 320 may latch the received second pre-latch data PLD2 at the rising edge of the second division strobe signal QDQS, and may output the latched second pre-latch data PLD2 as the second latch data LD2.

At time T23, the division strobe signal generation circuit 251 may generate the third division strobe signal IBDQS by dividing the frequency of the input strobe signal IN_DQS.

The pre-latch data generation circuit 310 may generate the third pre-latch data PLD3 by latching the received third input data IN_D<3> at a rising edge of the third division strobe signal IBDQS.

At time T24, the division strobe signal generation circuit 251 may generate the fourth division strobe signal QBDQS by dividing the frequency of the input strobe signal IN_DQS.

The pre-latch data generation circuit 310 may generate the fourth pre-latch data PLD4 by latching the received fourth input data IN_D<4> at a rising edge of the fourth division strobe signal QBDQS.

The latch data output circuit 320 may latch the received third pre-latch data PLD3 at a rising edge of the fourth division strobe signal QBDQS, and may output the latched third pre-latch data PLD3 as the third latch data LD3. The latch data output circuit 320 may latch the received fourth pre-latch data PLD4 at a rising edge of the fourth division strobe signal QBDQS, and may output the latched fourth pre-latch data PLD4 as the fourth latch data LD4.

Thereafter, an operation of generating the first latch data LD1, the second latch data LD2, the third latch data LD3, and the fourth latch data LD4 from the fifth to sixteenth input data IN_D<5:16> is the same as the operation of generating the first latch data LD1, the second latch data LD2, the third latch data LD3, and the fourth latch data LD4 from the first to fourth input data IN_D<1:4>, and thus a detailed description thereof is omitted.

In the second operation mode, the length of the input data may be set as the burst length 8 (BL8), and the first to eighth input data IN_D<1:8> are serially received after the sixteenth input data IN_D<16> is received in the first operation mode.

At time T25, the division strobe signal generation circuit 251 may generate the first division strobe signal IDQS by dividing the frequency of the input strobe signal IN_DQS.

The pre-latch data generation circuit 310 may generate the first pre-latch data PLD1 by latching the received first input data IN_D<1> at a rising edge of the first division strobe signal IDQS.

At time T26, the division strobe signal generation circuit 251 may generate the second division strobe signal QDQS by dividing the frequency of the input strobe signal IN_DQS.

The pre-latch data generation circuit 310 may generate the second pre-latch data PLD2 by latching the received second input data IN_D<2> at a rising edge of the second division strobe signal QDQS.

The latch data output circuit 320 may latch the received first pre-latch data PLD1 at a rising edge of the second division strobe signal QDQS, and may output the latched first pre-latch data PLD1 as the first latch data LD1. The latch data output circuit 320 may latch the received second pre-latch data PLD2 at a rising edge of the second division strobe signal QDQS, and may output the latched second pre-latch data PLD2 as the second latch data LD2.

At time T27, the division strobe signal generation circuit 251 may generate the third division strobe signal IBDQS by dividing the frequency of the input strobe signal IN_DQS.

The pre-latch data generation circuit 310 may generate the third pre-latch data PLD3 by latching the received third input data IN_D<3> at a rising edge of the third division strobe signal IBDQS.

At time T28, the division strobe signal generation circuit 251 may generate the fourth division strobe signal QBDQS by dividing the frequency of the input strobe signal IN_DQS.

The pre-latch data generation circuit 310 may generate the fourth pre-latch data PLD4 by latching the received fourth input data IN_D<4> at a rising edge of the fourth division strobe signal QBDQS.

The latch data output circuit 320 may latch the received third pre-latch data PLD3 at a rising edge of the fourth division strobe signal QBDQS, and may output the latched third pre-latch data PLD3 as the third latch data LD3. The latch data output circuit 320 may latch the received fourth pre-latch data PLD4 at a rising edge of the fourth division strobe signal QBDQS, and may output the latched fourth pre-latch data PLD4 as the fourth latch data LD4.

Thereafter, an operation of generating the first latch data LD1, the second latch data LD2, the third latch data LD3, and the fourth latch data LD4 from the fifth to eighth input data IN_D<5:8> is the same as the operation of generating the first latch data LD1, the second latch data LD2, the third latch data LD3, and the fourth latch data LD4 from the first to fourth input data IN_D<1:4>, and thus a detailed description thereof is omitted.

Figure 18:
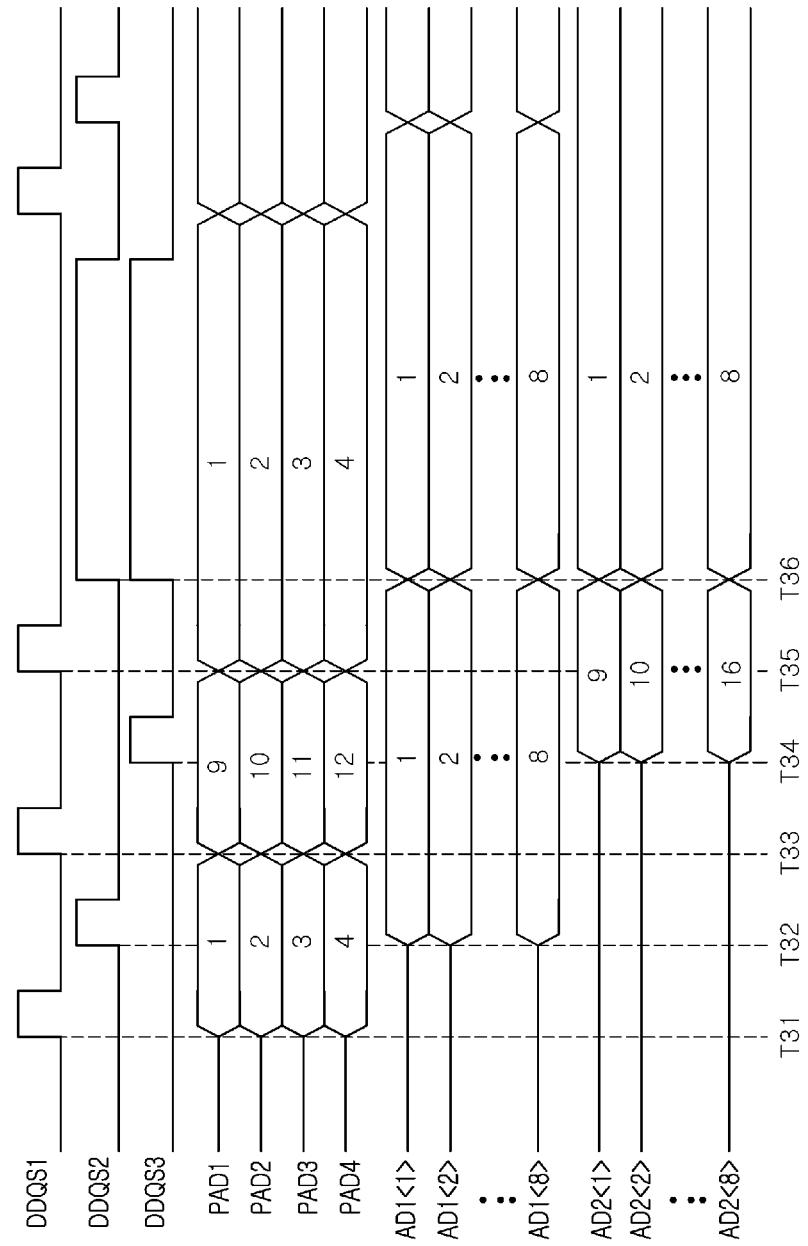

FIG. 18 is a timing diagram describing example data alignment operation of the semiconductor system according to an embodiment of the present disclosure.

An operation of generating the first alignment data AD1<1:8> and the second alignment data AD2<1:8> from the first latch data LD1, the second latch data LD2, the third latch data LD3, and the fourth latch data LD4 when the first operation mode and the second operation mode are consecutively performed is described as follows with reference to FIG. 18.

At time T31, the internal strobe signal generation circuit 252 may generate the first internal strobe signal DDQS1 based on the second division strobe signal QDQS and the fourth division strobe signal QBDQS. The time T31 may be the same time as the time T24 described with reference to FIG. 17.

The first latch 411_1 of the first alignment data generation circuit 411 may generate the first pre-alignment data PAD1 by latching the first latch data LD1 in synchronization with the first internal strobe signal DDQS1. The first latch 411_1 may generate the second pre-alignment data PAD2 by latching the second latch data LD2 in synchronization with the first internal strobe signal DDQS1.

The sixth latch 412_1 of the second alignment data generation circuit 412 may generate the third pre-alignment data PAD3 by latching the third latch data LD3 in synchronization with the first internal strobe signal DDQS1. The sixth latch 412_1 may generate the fourth pre-alignment data PAD4 by latching the fourth latch data LD4 in synchronization with the first internal strobe signal DDQS1.

At time T32, the internal strobe signal generation circuit 252 may generate the second internal strobe signal DDQS2 based on the second division strobe signal QDQS and the fourth division strobe signal QBDQS. The time T32 may be the time at which the second pulse of the fourth division strobe signal QBDQS is generated.

The second latch 411_2 of the first alignment data generation circuit 411 may generate the first bit AD1<1> of the first alignment data by latching the first pre-alignment data PAD1 in synchronization with the second internal strobe signal DDQS2. The second latch 411_2 may generate the second bit AD1<2> of the first alignment data by latching the second pre-alignment data PAD2 in synchronization with the second internal strobe signal DDQS2. The fourth latch 411_4 may generate the third bit AD1<3> of the first alignment data by latching the first latch data LD1 in synchronization with the second internal strobe signal DDQS2. The fourth latch 411_4 may generate the fourth bit AD1<4> of the first alignment data by latching the second latch data LD2 in synchronization with the second internal strobe signal DDQS2.

The seventh latch 412_2 of the second alignment data generation circuit 412 may generate the fifth bit AD1<5> of the first alignment data by latching the third pre-alignment data PAD3 in synchronization with the second internal strobe signal DDQS2. The seventh latch 412_2 may generate the sixth bit AD1<6> of the first alignment data by latching the fourth pre-alignment data PAD4 in synchronization with the second internal strobe signal DDQS2. The ninth latch 412_4 may generate the seventh bit AD1<7> of the first alignment data by latching the third latch data LD3 in synchronization with the second internal strobe signal DDQS2. The ninth latch 412_4 may generate the eighth bit AD1<8> of the first alignment data by latching the fourth latch data LD4 in synchronization with the second internal strobe signal DDQS2.

The first alignment data AD1<1:8> generated at time T32 may be generated from the first to eighth input data IN_D<1:8> that are serially received in the first operation mode.

At time T33, the internal strobe signal generation circuit 252 may generate the first internal strobe signal DDQS1 based on the second division strobe signal QDQS and the fourth division strobe signal QBDQS. Time T33 may be the time at which the third pulse of the fourth division strobe signal QBDQS is generated.

The first latch 411_1 of the first alignment data generation circuit 411 may generate the first pre-alignment data PAD1 by latching the first latch data LD1 in synchronization with the first internal strobe signal DDQS1. The first latch 411_1 may generate the second pre-alignment data PAD2 by latching the second latch data LD2 in synchronization with the first internal strobe signal DDQS1.

The sixth latch 412_1 of the second alignment data generation circuit 412 may generate the third pre-alignment data PAD3 by latching the third latch data LD3 in synchronization with the first internal strobe signal DDQS1. The sixth latch 412_1 may generate the fourth pre-alignment data PAD4 by latching the fourth latch data LD4 in synchronization with the first internal strobe signal DDQS1.

At time T34, the internal strobe signal generation circuit 252 may generate the third internal strobe signal DDQS3 based on the second division strobe signal QDQS and the fourth division strobe signal QBDQS. The time T34 may be set as time at which the fourth pulse of the fourth division strobe signal QBDQS is generated.

The third latch 411_3 of the first alignment data generation circuit 411 may generate the first bit AD2<1> of the second alignment data by latching the first pre-alignment data PAD1 in synchronization with the third internal strobe signal DDQS3. The third latch 411_3 may generate the second bit AD2<2> of the second alignment data by latching the second pre-alignment data PAD2 in synchronization with the third internal strobe signal DDQS3. The fifth latch 411_5 may generate the third bit AD2<3> of the second alignment data by latching the first latch data LD1 in synchronization with the third internal strobe signal DDQS3. The fifth latch 411_5 may generate the fourth bit AD2<4> of the second alignment data by latching the second latch data LD2 in synchronization with the third internal strobe signal DDQS3.

The eighth latch 412_3 of the second alignment data generation circuit 412 may generate the fifth bit AD2<5> of the second alignment data by latching the third pre-alignment data PAD3 in synchronization with the third internal strobe signal DDQS3. The eighth latch 412_3 may generate the sixth bit AD2<6> of the second alignment data by latching the fourth pre-alignment data PAD4 in synchronization with the third internal strobe signal DDQS3. The tenth latch 412_5 may generate the seventh bit AD2<7> of the second alignment data by latching the third latch data LD3 in synchronization with the third internal strobe signal DDQS3. The tenth latch 412_5 may generate the eighth bit AD2<8> of the second alignment data by latching the fourth latch data LD4 in synchronization with the third internal strobe signal DDQS3.

The second alignment data AD2<1:8> generated at the time T34 may be generated from the ninth to sixteenth input data IN_D<9:16> that are serially received in the first operation mode.

At time T35, the internal strobe signal generation circuit 252 may generate the first internal strobe signal DDQS1 based on the second division strobe signal QDQS and the fourth division strobe signal QBDQS. The time T35 may be the time at which the fifth pulse of the fourth division strobe signal QBDQS is generated.

The first latch 411_1 of the first alignment data generation circuit 411 may generate the first pre-alignment data PAD1 by latching the first latch data LD1 in synchronization with the first internal strobe signal DDQS1. The first latch 411_1 may generate the second pre-alignment data PAD2 by latching the second latch data LD2 in synchronization with the first internal strobe signal DDQS1.

The sixth latch 412_1 of the second alignment data generation circuit 412 may generate the third pre-alignment data PAD3 by latching the third latch data LD3 in synchronization with the first internal strobe signal DDQS1. The sixth latch 412_1 may generate the fourth pre-alignment data PAD4 by latching the fourth latch data LD4 in synchronization with the first internal strobe signal DDQS1.

At time T36, the internal strobe signal generation circuit 252 may simultaneously generate the second internal strobe signal DDQS2 and the third internal strobe signal DDQS3 based on the second division strobe signal QDQS and the fourth division strobe signal QBDQS that are not toggled.

The second latch 411_2 of the first alignment data generation circuit 411 may generate the first bit AD1<1> of the first alignment data by latching the first pre-alignment data PAD1 in synchronization with the second internal strobe signal DDQS2. The second latch 411_2 may generate the second bit AD1<2> of the first alignment data by latching the second pre-alignment data PAD2 in synchronization with the second internal strobe signal DDQS2.

At T36, the third latch 411_3 may generate the first bit AD2<1> of the second alignment data by latching the first pre-alignment data PAD1 in synchronization with the third internal strobe signal DDQS3. At T36, the third latch 411_3 may generate the second bit AD2<2> of the second alignment data by latching the second pre-alignment data PAD2 in synchronization with the third internal strobe signal DDQS3.

The fourth latch 411_4 may generate the third bit AD1<3> of the first alignment data by latching the first latch data LD1 in synchronization with the second internal strobe signal DDQS2. The fourth latch 411_4 may generate the fourth bit AD1<4> of the first alignment data by latching the second latch data LD2 in synchronization with the second internal strobe signal DDQS2.

The fifth latch 411_5 may generate the third bit AD2<3> of the second alignment data by latching the first latch data LD1 in synchronization with the third internal strobe signal DDQS3. The fifth latch 411_5 may generate the fourth bit AD2<4> of the second alignment data by latching the second latch data LD2 in synchronization with the third internal strobe signal DDQS3.

The seventh latch 412_2 of the second alignment data generation circuit 412 may generate the fifth bit AD1<5> of the first alignment data by latching the third pre-alignment data PAD3 in synchronization with the second internal strobe signal DDQS2. The seventh latch 412_2 may generate the sixth bit AD1<6> of the first alignment data by latching the fourth pre-alignment data PAD4 in synchronization with the second internal strobe signal DDQS2.

The eighth latch 412_3 may generate the fifth bit AD2<5> of the second alignment data by latching the third pre-alignment data PAD3 in synchronization with the third internal strobe signal DDQS3. The eighth latch 412_3 may generate the sixth bit AD2<6> of the second alignment data by latching the fourth pre-alignment data PAD4 in synchronization with the third internal strobe signal DDQS3.

The ninth latch 412_4 may generate the seventh bit AD1<7> of the first alignment data by latching the third latch data LD3 in synchronization with the second internal strobe signal DDQS2. The ninth latch 412_4 may generate the eighth bit AD1<8> of the first alignment data by latching the fourth latch data LD4 in synchronization with the second internal strobe signal DDQS2.

The tenth latch 412_5 may generate the seventh bit AD2<7> of the second alignment data by latching the third latch data LD3 in synchronization with the third internal strobe signal DDQS3. The tenth latch 412_5 may generate the eighth bit AD2<8> of the second alignment data by latching the fourth latch data LD4 in synchronization with the third internal strobe signal DDQS3.

The first alignment data AD1<1:8> and the second alignment data AD2<1:8> generated at the time T36 may be generated from the first to eighth input data IN_D<1:8> that are serially received in the second operation mode.

Figure 19:
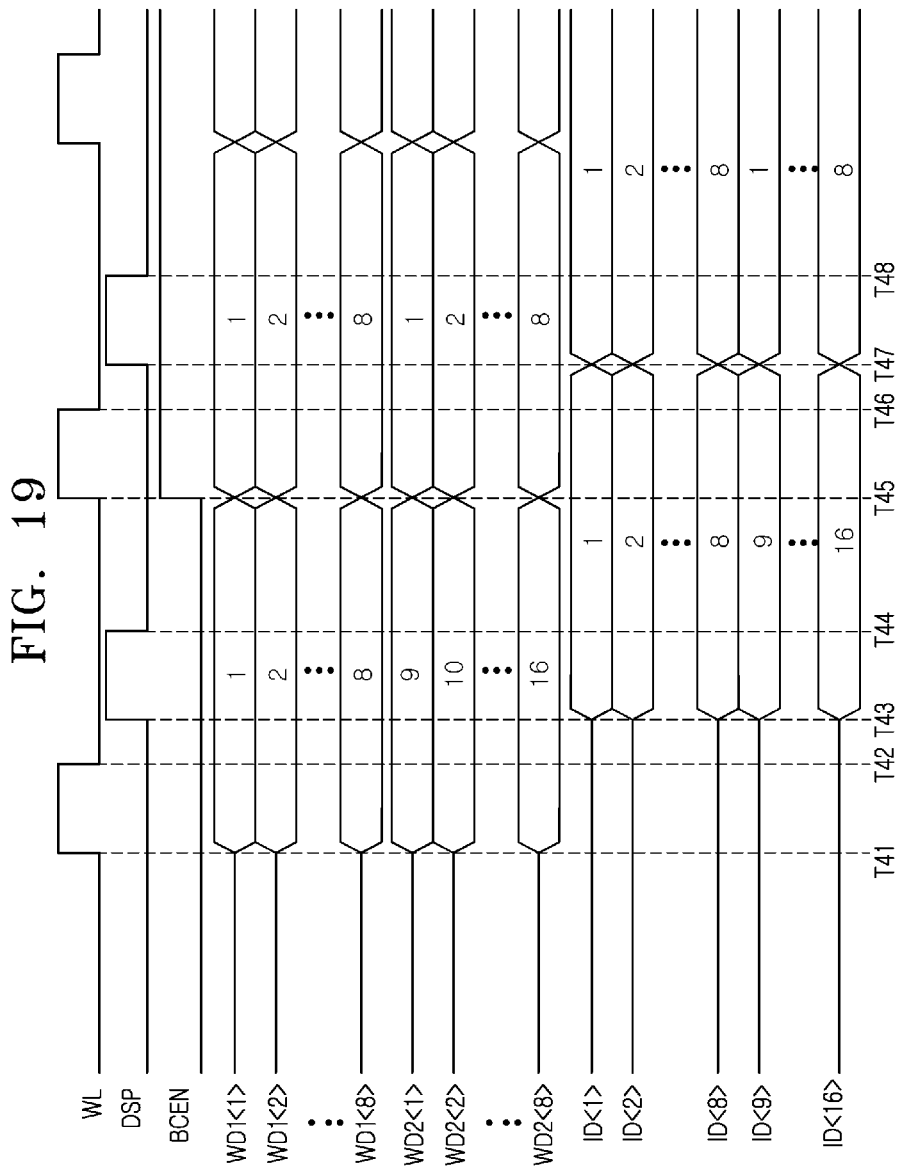

FIG. 19 is a timing diagram describing example data alignment operations according to embodiments of the present disclosure.

The timing diagram of FIG. 19 shows the latch clock WL, the data pulse signal DSP, the burst enable signal BCEN, eight bits of the first write data WD1, eight bits of the second write data WD2, and sixteen bits of the internal data ID.

Prior to time T41, the latch clock WL is at a logic low state, the data pulse signal DSP is in a logic low state, and the burst enable signal BCEN is in a logic low state to indicate 16 bit burst operation.

At time T41, the latch clock WL toggles to a logic high state. The first and second write data WD1 and WD2, which were originally received in series as 16 bits of DATA, are aligned as the first and second write data WD1 and WD2 and latched by the write alignment circuit 272. The first and second write data WD1 and WD2 are latched by the latch clock WL and output to the internal data generation circuit 273.

At time T42, the latch clock WL toggles to a logic low state.

At time T43, the data pulse signal DSP is asserted to a logic high state. This enables the internal data generation circuit 273 to latch the eight bits of WD1 and the eight bits of WD2 from the write alignment circuit 272 to output 16 bits of internal data ID<1:16>. The 16 bits of internal data ID<1:16> may now be written to a memory device such as the core circuit 280.

At time T44, the data pulse signal DSP is deasserted to a logic low state.

At time T45, the burst enable signal BCEN is asserted to a logic high state to indicate 8 bit burst operation, and the latch clock WL toggles to a logic high state. The next set of first and second write data WD1 and WD2 are thus latched by the write alignment circuit 272 and provided to the internal data generation circuit 273.

At time T46, the latch clock WL toggles to a logic low state.

At time T47, the data pulse signal DSP is asserted to a logic high state. This enables the internal data generation circuit 273 to latch eight bits of WD1<1:8> and eight bits of WD2<1:8> to output 16 bits of internal data ID<1:16>.

At time T48, the data pulse signal DSP is deasserted to a logic low state.

Accordingly, the timing diagram of FIG. 19 for example operations shows write data that is generated by the data alignment circuit at which a data alignment operation is performed so that the write data has the same data window when the first operation mode and the second operation mode are consecutively performed. This may allow securing a margin of time for a domain crossing operation by generating write data so that the write data has the same data window when the first operation mode and the second operation mode are performed consecutively.

Figure 20:
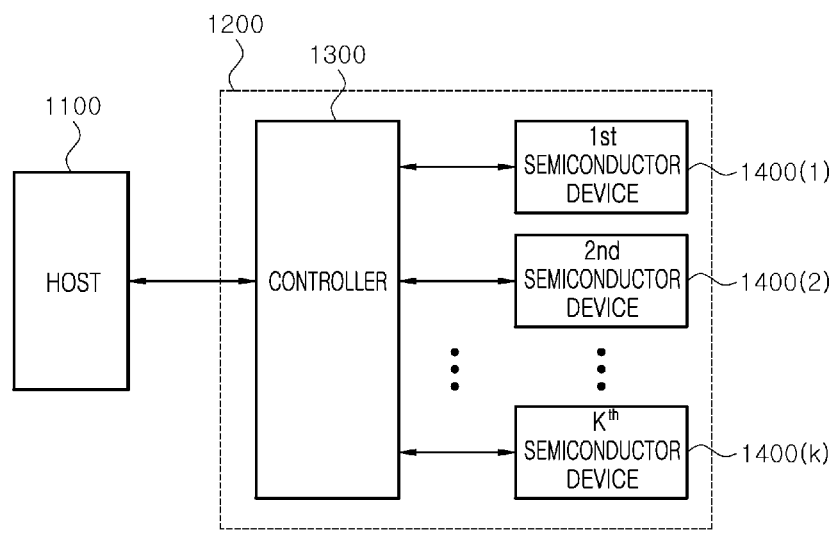
FIG. 20 is a diagram illustrating an example electronic system to which the semiconductor system illustrated in FIGS. 1 to 19 has been applied according to an embodiment of the present disclosure.

FIG. 20 is a block diagram illustrating an example electronic system according to an embodiment of the present disclosure. As illustrated in FIG. 20, an electronic system 1000 may include a host 1100 and a semiconductor system 1200.

The host 1100 and the semiconductor system 1200 may transmit signals by using an interface protocol, such as, for example, a multi-media card (MMC), an enhanced small disk interface (ESDI), integrated drive electronics (IDE), a peripheral component interconnect-express (PCI-E), advanced technology attachment (ATA), serial ATA (SATA), parallel ATA (PATA), a serial attached SCSI (SAS), a universal serial bus (USB), etc.

The semiconductor system 1200 may include a controller 1300 and one or more semiconductor devices 1400. The controller 1300 may control operation of the semiconductor devices 1400. Each of the semiconductor devices 1400 may generate write data that is generated by the data alignment circuit at which a data alignment operation is performed so that the write data has the same data window when the first operation mode and the second operation mode are consecutively performed. Each of the semiconductor devices 1400 can secure a margin of time for a domain crossing operation by generating write data that is generated in the data alignment circuit at which a data alignment operation is performed so that the write data has the same data window when the first operation mode and the second operation mode are consecutively performed.

The controller 1300 may be implemented as the controller 10 illustrated in FIG. 1. One or more of the semiconductor devices 1400 may be implemented as the semiconductor device 20 illustrated in FIG. 1. According to an embodiment, the semiconductor device 20 may be implemented using one or more of, for example, dynamic random access memory (DRAM), phase change random access memory (PRAM), resistive random access memory (RRAM), magnetic random access memory (MRAM), ferroelectric random access memory (FRAM), etc.

What is claimed is:

1. A semiconductor device comprising:
    a mode control circuit configured to generate a burst enable signal that is enabled in a second operation mode based on a mode register signal, a burst control signal, and a mode setting signal for setting a first operation mode and the second operation mode in synchronization with a latch clock that is generated from a clock; and
    a data alignment circuit configured to:
        align a first group and second group of input data in synchronization with first to third internal strobe signals that are generated from a strobe signal;
        generate first and second write data from at least any one of the aligned first group and second group of the input data based on a logic level of the burst enable signal in synchronization with the latch clock; and
        generate internal data from the first and second write data.

2. The semiconductor device of claim 1, wherein the mode control circuit comprises:
    an operation mode signal generation circuit configured to generate an operation mode signal that is enabled in the second operation mode based on a logic level combination of the mode register signal, the burst control signal, and the mode setting signal; and
    a burst enable signal generation circuit configured to generate the burst enable signal by latching the operation mode signal in synchronization with the latch clock.

3. The semiconductor device of claim 1, wherein the data alignment circuit is configured to perform a domain crossing operation of aligning the first group and second group of the input data in synchronization with the first to third internal strobe signals and generating the internal data from at least any one of the aligned first group and second group of the input data in synchronization with the latch clock.

4. The semiconductor device of claim 1, wherein the data alignment circuit is configured to align the first group and second group of the input data and generate the internal data from the aligned first group and second group of the input data, after a start of the first operation mode.

5. The semiconductor device of claim 1, wherein the data alignment circuit is configured to align the first group of the input data and generate the internal data from the aligned first group of the input data, after a start of the second operation mode.

6. The semiconductor device of claim 1, wherein in a continuous operation of the first operation mode and the second operation mode, the first write data and the second write data have an identical data window.

7. The semiconductor device of claim 1, wherein the data alignment circuit comprises:
    a latch data generation circuit configured to generate first to the fourth latch data by latching the first group and second group of the input data that are serially received in synchronization with first to fourth division strobe signals that are generated by dividing an input strobe signal;
    a write alignment circuit configured to:
        align the first to fourth latch data in synchronization with the first to third internal strobe signals; and
        generate the first and second write data from the first to fourth latch data that are latched in synchronization with the latch clock; and
    an internal data generation circuit configured to generate the internal data from the first and second write data in synchronization with a data pulse signal that is generated by delaying the latch clock.

8. The semiconductor device of claim 7, wherein the latch data generation circuit comprises:
    a pre-latch data generation circuit configured to generate first to fourth pre-latch data by latching the first group and second group of the input data in synchronization with the first to fourth division strobe signals; and
    a latch data output circuit configured to:
        generate the first and second latch data from the first and second pre-latch data in synchronization with the second division strobe signal; and
        generate the third and fourth latch data from the third and fourth pre-latch data in synchronization with the fourth division strobe signal.

9. The semiconductor device of claim 7, wherein the write alignment circuit comprises:
    an alignment data generation circuit configured to:
        receive the first to fourth latch data in synchronization with the first internal strobe signal;
        align the first to fourth latch data in synchronization with the second and third internal strobe signals; and
        output the aligned first to fourth latch data as first and second alignment data; and
    a write data generation circuit configured to:
        generate the first and second write data from the first and second alignment data in synchronization with the latch clock after a start of the first operation mode; and
        the first and second write data from the first alignment data in synchronization with the latch clock after a start of the second operation mode.

10. The semiconductor device of claim 9, wherein the alignment data generation circuit comprises:
    a first alignment data generation circuit configured to generate bits of the first and second alignment data from the first and second latch data in synchronization with the first to third internal strobe signals; and
    a second alignment data generation circuit configured to generate bits of the first and second alignment data from the third and fourth latch data in synchronization with the first to third internal strobe signals.

11. The semiconductor device of claim 10, wherein the first alignment data generation circuit comprises:

a first latch configured to:
  receive the first and second latch data in synchronization with the first internal strobe signal; and
  generate first and second pre-alignment data;
a second latch configured to generate bits of the first alignment data by latching the first and second pre-alignment data in synchronization with the second internal strobe signal;
a third latch configured to generate bits of the second alignment data by latching the first and second pre-alignment data in synchronization with the third internal strobe signal;
a fourth latch configured to generate bits of the first alignment data by latching the first and second latch data in synchronization with the second internal strobe signal; and
a fifth latch configured to generate bits of the second alignment data by latching the first and second latch data in synchronization with the third internal strobe signal.

12. The semiconductor device of claim 10, wherein the second alignment data generation circuit comprises:
a sixth latch configured to:
  receive the third and fourth latch data in synchronization with the first internal strobe signal; and
  generate third and fourth pre-alignment data;
a seventh latch configured to generate bits of the first alignment data by latching the third and fourth pre-alignment data in synchronization with the second internal strobe signal;
an eighth latch configured to generate bits of the second alignment data by latching the third and fourth pre-alignment data in synchronization with the third internal strobe signal;
a ninth latch configured to generate bits of the first alignment data by latching the third and fourth latch data in synchronization with the second internal strobe signal; and
a tenth latch configured to generate bits of the second alignment data by latching the third and fourth latch data in synchronization with the third internal strobe signal.

13. The semiconductor device of claim 9, wherein the write data generation circuit comprises:
a first write data generation circuit configured to:
  generate bits of the first and second write data from bits of the first and second alignment data in synchronization with the latch clock after a start of the first operation mode; and
  generate the first and second write data from bits of the first alignment data in synchronization with the latch clock after a start of the second operation mode; and
a second write data generation circuit configured to:
  generate bits of the first and second write data from the bits of the first and second alignment data in synchronization with the latch clock after the start of the first operation mode; and
  generate bits of the first and second write data from bits of the first alignment data in synchronization with the latch clock after the start of the second operation mode.

14. The semiconductor device of claim 13, wherein the first write data generation circuit comprises:
an eleventh latch configured to generate bits of the first write data and bits of first pre-write data by latching bits of the first alignment data in synchronization with the latch clock:
a first selection transfer circuit configured to generate bits of the second write data from any one of the bits of the first pre-write data and bits of the second alignment data by a burst enable signal;
a twelfth latch configured to generate bits of the first write data and bits of the first pre-write data by latching bits of the first alignment data in synchronization with the latch clock; and
a second selection transfer circuit configured to generate bits of the second write data from any one of the bits of the first pre-write data and the bits of the second alignment data by the burst enable signal.

15. The semiconductor device of claim 13, wherein the second write data generation circuit comprises:
a thirteenth latch configured to generate the bits of the first write data and bits of second pre-write data by latching the bits of the first alignment data in synchronization with the latch clock;
a third selection transfer circuit configured to generate the bits of the second write data from any one of the bits of the second pre-write data and the bits of the second alignment data by a burst enable signal;
a fourteenth latch configured to generate the bits of the first write data and bits of second pre-write data by latching the bits of the first alignment data in synchronization with the latch clock; and
a fourth selection transfer circuit configured to generate the bits of the second write data from any one of the bits of the second pre-write data and the bits of the second alignment data by the burst enable signal.

* * * * *